United States Patent
We et al.

(10) Patent No.: US 9,401,350 B1
(45) Date of Patent: Jul. 26, 2016

(54) PACKAGE-ON-PACKAGE (POP) STRUCTURE INCLUDING MULTIPLE DIES

(71) Applicant: QUALCOMM Incorporated, San Diego, CA (US)

(72) Inventors: Hong Bok We, San Diego, CA (US); Jae Sik Lee, San Diego, CA (US); Dong Wook Kim, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/812,476

(22) Filed: Jul. 29, 2015

(51) Int. Cl.
```
H01L 25/18      (2006.01)
H01L 23/522     (2006.01)
H01L 23/532     (2006.01)
H01L 21/56      (2006.01)
H01L 21/768     (2006.01)
H01L 25/00      (2006.01)
H01L 21/52      (2006.01)
H01L 23/00      (2006.01)
H01L 23/528     (2006.01)
H01L 23/31      (2006.01)
```

(52) U.S. Cl.
CPC ............... *H01L 25/18* (2013.01); *H01L 21/52* (2013.01); *H01L 21/563* (2013.01); *H01L 21/76802* (2013.01); *H01L 21/76879* (2013.01); *H01L 23/3157* (2013.01); *H01L 23/528* (2013.01); *H01L 23/5226* (2013.01); *H01L 23/53238* (2013.01); *H01L 24/27* (2013.01); *H01L 24/33* (2013.01); *H01L 25/50* (2013.01); *H01L 2224/28105* (2013.01); *H01L 2224/32235* (2013.01); *H01L 2924/01029* (2013.01); *H01L 2924/1432* (2013.01); *H01L 2924/1434* (2013.01); *H01L 2924/1811* (2013.01)

(58) Field of Classification Search
CPC ....... H01L 21/56; H01L 25/18; H01L 21/563; H01L 21/76879; H01L 23/5226
See application file for complete search history.

(56) References Cited

U.S. PATENT DOCUMENTS 6,038,137 A  3/2000 Bhatt et al.
6,404,043 B1 6/2002 Isaak
(Continued)

OTHER PUBLICATIONS

Werbaneth. P., et al., "Polyimide for flip chip packaging" Solid State Technology Insights for Electronics Manufacturing, Retrieved on Feb. 4, 2015, pp. 3, URL: electroiq.com/blog/2002/02/polyimide-for-flip-chip-packaging/.

*Primary Examiner* — Phuc Dang
(74) *Attorney, Agent, or Firm* — Toler Law Group, PC

(57) ABSTRACT

A package-on-package (POP) structure is disclosed. The POP structure includes a first die, a second die, and a photo-imaged dielectric (PID) layer. The PID layer is disposed between the first die and the second die. The POP structure also includes a first conductive path from the first die through the PID layer to the second die. The first conductive path extends directly through a first area of the PID layer directly between the first die and the second die. The POP structure further includes a second conductive path from the first die through the PID layer to the second die. A particular portion of the second conductive path is perpendicular to the first conductive path and extends through a second area of the PID layer not directly between the first die and the second die.

14 Claims, 21 Drawing Sheets

(56) References Cited

U.S. PATENT DOCUMENTS

| | | |
|---|---|---|
| 6,437,433 B1 | 8/2002 | Ross |
| 7,335,994 B2 | 2/2008 | Klein et al. |
| 8,558,374 B2 | 10/2013 | Markovich et al. |
| 2011/0024890 A1* | 2/2011 | Yang .................. H01L 24/29 |
| | | 257/686 |
| 2012/0273960 A1* | 11/2012 | Park .................. H01L 21/4846 |
| | | 257/774 |
| 2015/0091149 A1* | 4/2015 | Jang .................. H01L 23/3128 |
| | | 257/686 |
| 2015/0255411 A1* | 9/2015 | Karhade ............... G06F 1/1686 |
| | | 361/679.55 |

* cited by examiner

PACKAGE-ON-PACKAGE (POP) STRUCTURE INCLUDING MULTIPLE DIES

I. FIELD

The present disclosure is generally related to package-on-package (POP) structures that include multiple dies.

II. DESCRIPTION OF RELATED ART

Advances in technology have resulted in smaller and more powerful computing devices. For example, there exist a variety of portable personal computing devices, including wireless telephones, such as mobile and smart phones, tablets and laptop computers, that are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing capabilities.

Electronic devices, such as wireless telephones, may include integrated circuits in a semiconductor device. A semiconductor device may include a first integrated circuit (IC) package and a second IC package. The first IC package may include a memory and the second IC package may include a processor. The first IC package and the second IC package may be co-planar. Metal traces may be used to form paths between the first IC package and the second IC package. A number of conductive paths between the first IC package and the second IC package may be limited because increasing the number of conductive paths may substantially increase complexity and cost of manufacturing the semiconductor device.

III. SUMMARY

The present disclosure provides a package-on-package (POP) structure that includes a first die and a second die. A photo-imaged dielectric (PID) layer may be disposed between the first die and the second die. The POP structure may include one or more conductive paths from the first die, through the PID layer, to the second die.

In a particular aspect, a package-on-package (POP) structure includes a first die, a second die, and a photo-imaged dielectric (PID) layer. The PID layer is disposed between the first die and the second die. The POP structure also includes a first conductive path from the first die through the PID layer to the second die. The first conductive path extends directly through a first area of the PID layer directly between the first die and the second die. The POP structure further includes a second conductive path from the first die through the PID layer to the second die. A portion of the second conductive path is perpendicular to the first conductive path and extends through a second area of the PID layer not directly between the first die and the second die.

In another aspect, a method of forming a package-on-package (POP) structure includes depositing a photo-imageable dielectric material on a surface of a package in which a first die is embedded. The method also includes patterning the photo-imageable dielectric material to form a photo-imaged dielectric (PID) layer. The method further includes depositing a conductive material on the PID layer to form a first conductive path and a second conductive path through the PID layer to the first die. The method also includes coupling a second die to the package such that the second die is electrically connected via the first conductive path and the second conductive path to the first die. The first conductive path extends directly through the PID layer from the first die to the second die. A portion of the second conductive path is perpendicular to the first conductive path and extends through an area of the PID layer not directly between the first die and the second die.

In another aspect, a method for forming a package-on-package (POP) structure includes depositing a photo-imageable dielectric material on a surface of a package in which a first die is embedded. The method also includes patterning the photo-imageable dielectric material to form a photo-imaged dielectric (PID) layer. The method further includes forming a first conductive path and a second conductive path from the first die, via the PID layer, to a second die. The first conductive path extends directly through the PID layer from the first die to the second die. A portion of the second conductive path is perpendicular to the first conductive path and extends through an area of the PID layer not directly between the first die and the second die.

One particular advantage provided by at least one of the disclosed aspects is that a package-on-package (POP) structure may include a direct conductive path in addition to other conductive paths between the first die and the second die. Having some conductive paths that extend directly between the first die and the second die may reduce complexity and cost of manufacturing the POP structure. Another particular advantage may be that the POP structure including a PID layer may include a greater number of conductive paths between the first die and the second die than another similar sized POP structure that excludes the PID layer. For example, a photo-via through the PID layer may be thinner (e.g., have a smaller diameter) than a through-silicon via (TSV). The POP structure having the PID layer may include a greater number of conductive paths between the first die and the second die than another similar-sized POP structure that excludes the PID layer because each conductive path through a photo-via of the PID layer may be thinner than a conductive path through a TSV of a POP structure that excludes the PID layer. The first die may have a distinct size than the second die. For example, the POP structure may include conductive paths from a first surface of the first die to a second surface of the second die. The first surface may have a first surface area that is larger (or smaller) than a second surface area of the second surface. Having some conductive paths that have a portion that is perpendicular to a straight conductive path between the first surface and the second surface may enable the POP structure to have conductive paths between a portion of the first surface and the second surface, where the portion of the first surface extends beyond the second surface.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
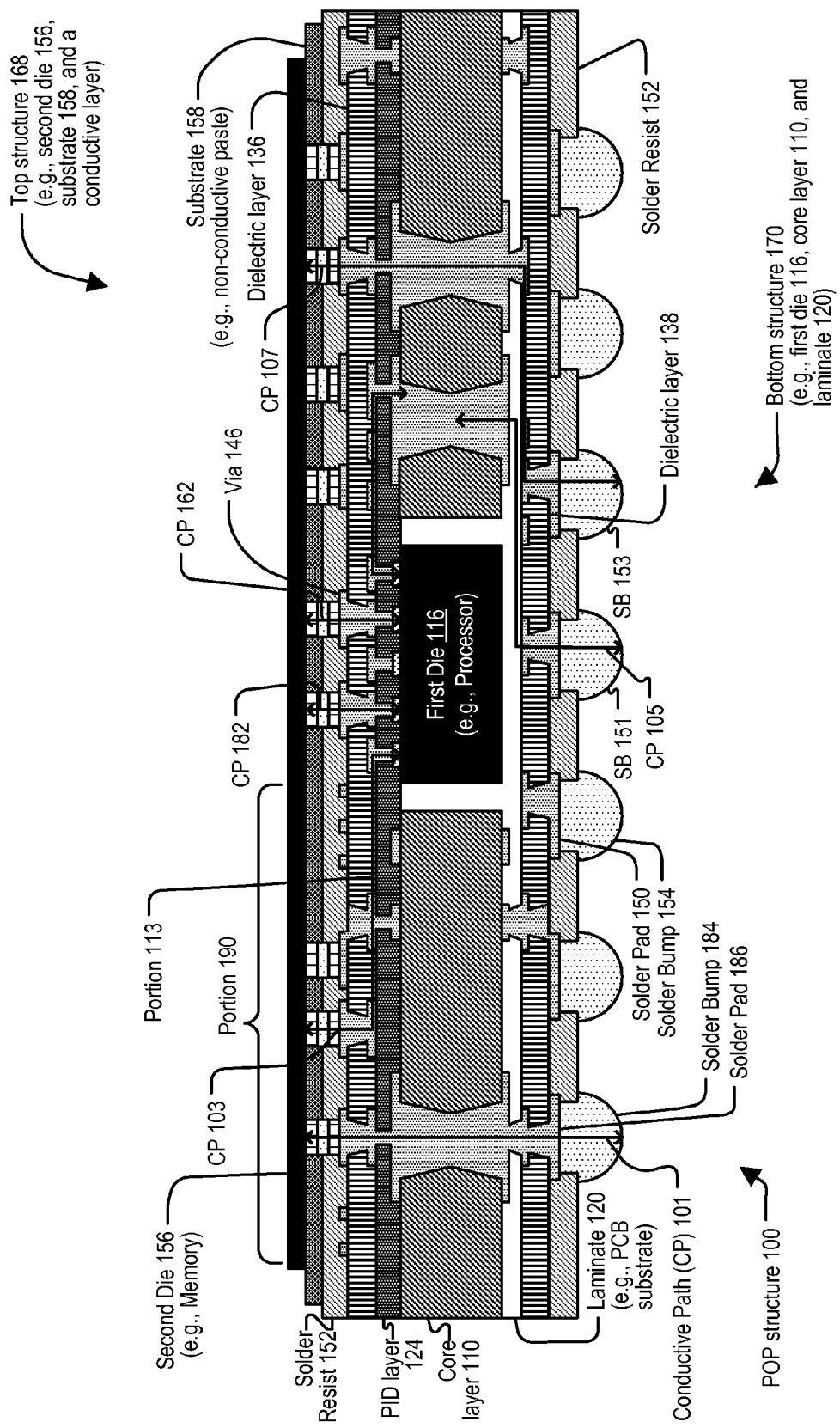
FIG. 1 is a cross-sectional view of a package-on-package (POP) structure.

Referring to FIG. 1, a particular illustrative aspect of a package-on-package (POP) structure is disclosed and generally designated 100. The POP structure 100 includes a first die 116 (e.g., a processor) and a second die 156 (e.g., memory). The first die 116 may include at least one of an application processor (AP), a digital signal processor (DSP), a graphics processor, or another processor. The second die 156 may include a cache memory, another memory, or both. In a particular implementation, the first die 116 may include a memory (e.g., a cache memory, another memory, or both) and the second die 156 may include a processor (e.g., an application processor (AP), a digital signal processor (DSP), a graphics processor, or another processor).

The first die 116 may have first dimensions (e.g., a first height, a first width, and a first length) that are distinct from second dimensions (e.g., a second height, a second width, and a second length) of the second die 156. For example, the first height may differ from the second height, the first width may differ from the second width, the first length may differ from the second length, or a combination thereof.

A photo-imaged dielectric (PID) layer 124 (e.g., a polyamide layer) may be disposed between the first die 116 and the second die 156. The POP structure 100 may include a top structure 168 (e.g., a top package) and a bottom structure 170 (e.g., a bottom package). The bottom structure 170 may include the first die 116 and a core layer 110. The core layer 110 may include silicon (Si), an organic material, or both.

In a particular aspect, the bottom structure 170 may also include a laminate 120, the PID layer 124, a dielectric layer 136, a dielectric layer 138, a solder resist 152, one or more seed layers, a via 146, one or more conductive layers, a solder pad 150, a solder pad 186, a solder bump 151, a solder bump 153, a solder bump 154, and a solder bump 184. The laminate 120 may include printed circuit board (PCB) substrate material (e.g., polymer resin). The laminate 120 may include non-conductive material. The dielectric layer 136, the dielectric layer 138, or both, may include components of polyimide, benzocyclobutene (BCB), silicon, hafnium, zirconium, barium, titanium, or a combination thereof. For example, the dielectric layer 136, the dielectric layer 138, or both, may include silicon monoxide, silicon dioxide, silicon nitride, hafnium oxide, zirconium oxide, barium titanate, titanium oxide, or a combination thereof. The solder resist 152 (e.g., a solder mask) may include a polymer. The one or more seed layers may include copper or other metal. The via 146, the one or more conductive layers, or a combination thereof, may include a conductive material (e.g., copper, tin, nickel, or another metal). The solder pad 150, the solder pad 186, the solder bump 151, the solder bump 153, the solder bump 154, the solder bump 184, or a combination thereof, may include a fusible metal alloy. For example, the solder pad 150, the solder pad 186, the solder bump 151, the solder bump 153, the solder bump 154, the solder bump 184, or a combination thereof, may include at least one of tin, lead, copper, silver, bismuth, indium, zinc, or antimony.

The top structure 168 may include the second die 156, one or more second conductive layers, and a substrate 158 (e.g., a memory substrate). The one or more second conductive layers may include a conductive material (e.g., copper, tin, nickel, or another metal). The substrate 158 may include a non-conductive paste (e.g., a non-conductive polymer paste).

The POP structure 100 may include one or more conductive paths from the first die 116, through the PID layer 124, to the second die 156. For example, the POP structure 100 includes a conductive path (CP)162 from the first die 116, through the via 146 (e.g., a metal via), to the second die 156, as further described with reference to FIG. 2. The via 146 may pass through the PID layer 124. As another example, the POP structure 100 may include a CP 182, a CP 103, or both, from the first die 116 to the second die 156.

The POP structure 100 may include one or more conductive paths from the first die 116 to solder bumps of the POP structure 100. For example, the POP structure 100 may include a CP 105 from the first die 116, through the PID layer 124, to the solder bump 151.

The POP structure 100 may include one or more conductive paths from the second die 156 to solder bumps of the POP structure 100. For example, the POP structure 100 may include a CP 107 from the second die 156, through the PID layer 124, to the solder bump 153. As another example, the POP structure 100 may include a CP 101 from the second die 156, through the PID layer 124, to the solder bump 184. The CP 101 may include a straight (or substantially straight) path from the second die 156 to the solder bump 184.

The POP structure 100 may include one or more conductive paths (e.g., the CP 162, the CP 182, or both) that extend directly through the PID layer 124 from the first die 116 to the second die 156. The CP 162, the CP 182, or both, may be straight (or substantially straight) paths between the first die 116 and the second die 156. The CP 103, CP 162, the CP 182, or a combination thereof, may extend from a first surface of the first die 116 to a second surface of the second die 156. The first surface of the first die 116 may face the second surface of the second die 156. The CP 101 may be parallel (or substantially parallel) to the CP 162, the CP 182, or both. The CP 103 may include at least one portion (e.g., a portion 113) that is perpendicular (or approximately perpendicular) to the conductive path 162, the conductive path 182, or both, as described further with reference to FIG. 2. The second die 156 may include at least one portion (e.g., a portion 190) that extends beyond the first die 116 along an axis (e.g., the horizontal axis of FIG. 1) that is perpendicular (or approximately perpendicular) to the CP 162, the CP 182, or both. The CP 103 may extend from the first surface of the first die 116 to the second surface of the second die 156. For example, CP 103 may extend from the first surface of the first die 116 to a surface of the portion 190 that corresponds to the second surface of the second die 156. Having the portion 113 that is perpendicular (or approximately perpendicular) to the CP 162, the CP 182, or both, may enable the CP 103 to extend from the portion 190 of the second die 156 to the first die 116, where the portion 190 extends beyond the first die 116 along the horizontal axis of FIG. 1.

A photo-via (e.g., the via 146) through the PID layer 124 may be thinner (e.g., have a smaller diameter) than a through-silicon via (TSV). The POP structure 100 having the PID layer 124 may include a greater number of conductive paths than another similar-sized POP structure that excludes the PID layer 124.

The POP structure 100 may be formed by implanting the first die 116 in the core layer 110, as described with reference to FIGS. 5-8, and forming the conductive paths 101, 103, 105, 107, 162, and 182, as described with reference to FIGS. 9-17. In a particular aspect, the POP structure 100 may be formed by depositing photo-imageable dielectric material on the bottom structure 170 to form the PID layer 124, as described with reference to FIG. 11 and forming the conductive paths 101, 103, 105, 107, 162, and 182, as described with reference to FIGS. 12-17.

Figure 2:
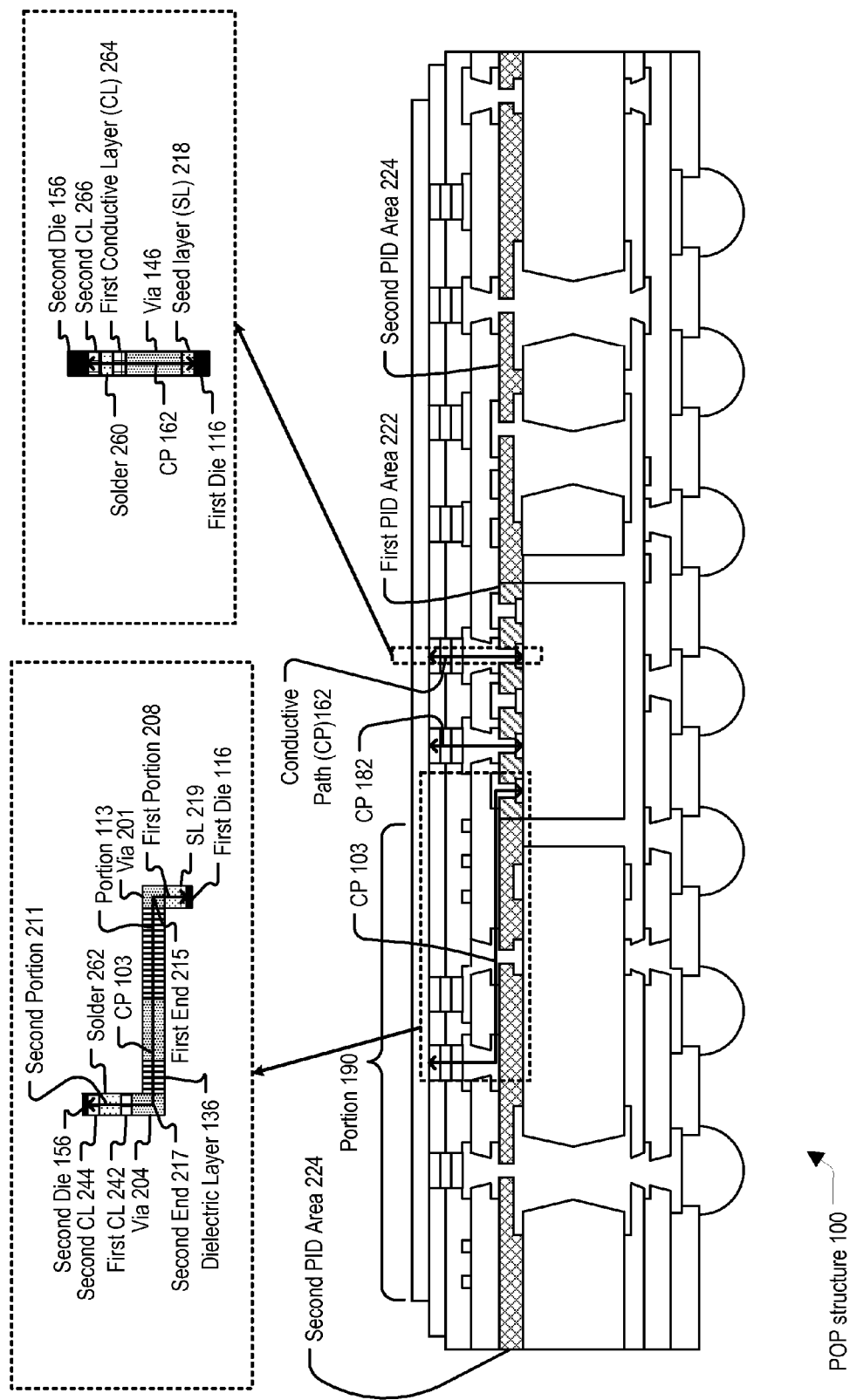
FIG. 2 is a diagram showing a side cross-sectional view of the POP structure of FIG. 1.
Figure 3:
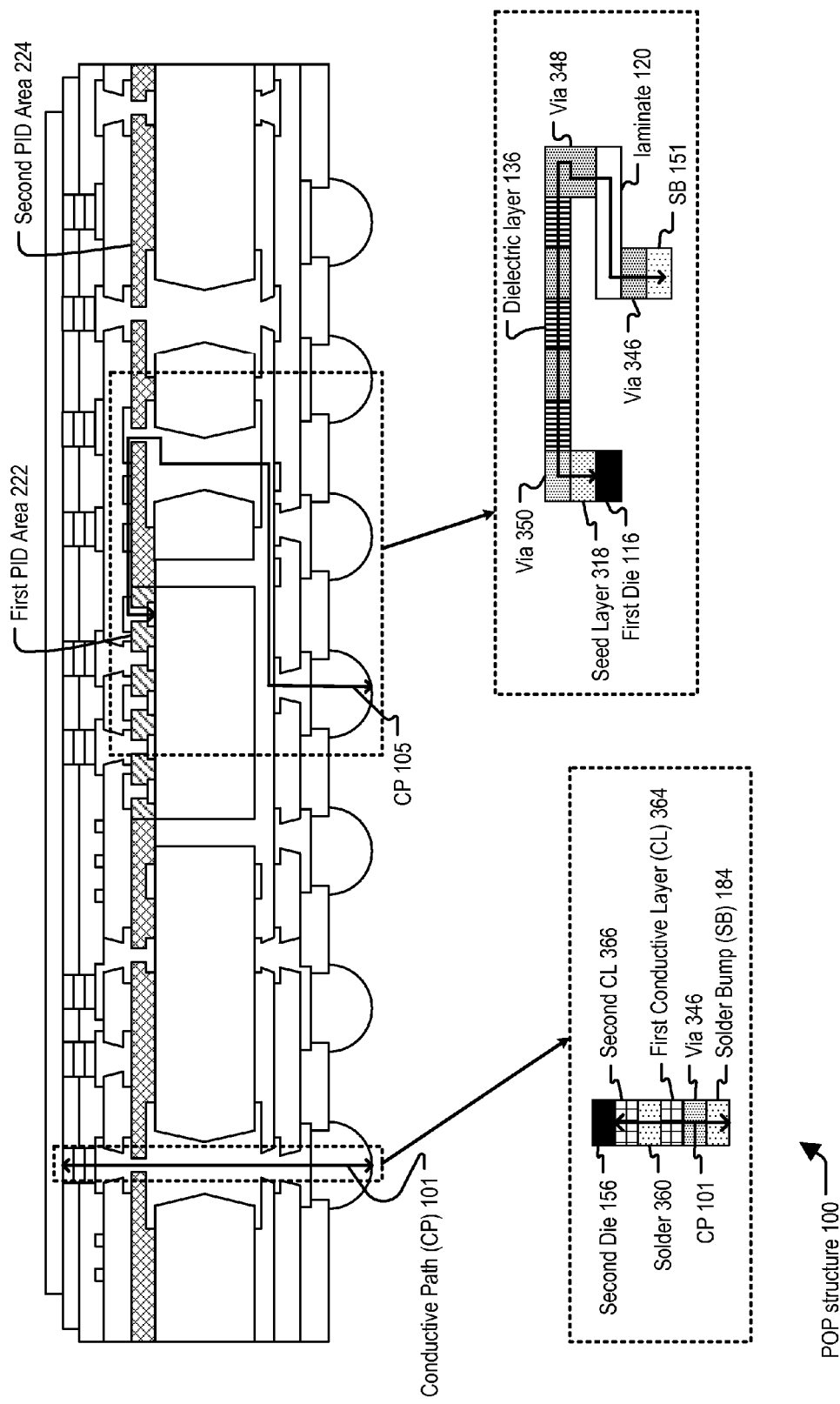
FIG. 3 is a diagram showing a side cross-sectional view of the POP structure of FIG. 1.
Figure 4:
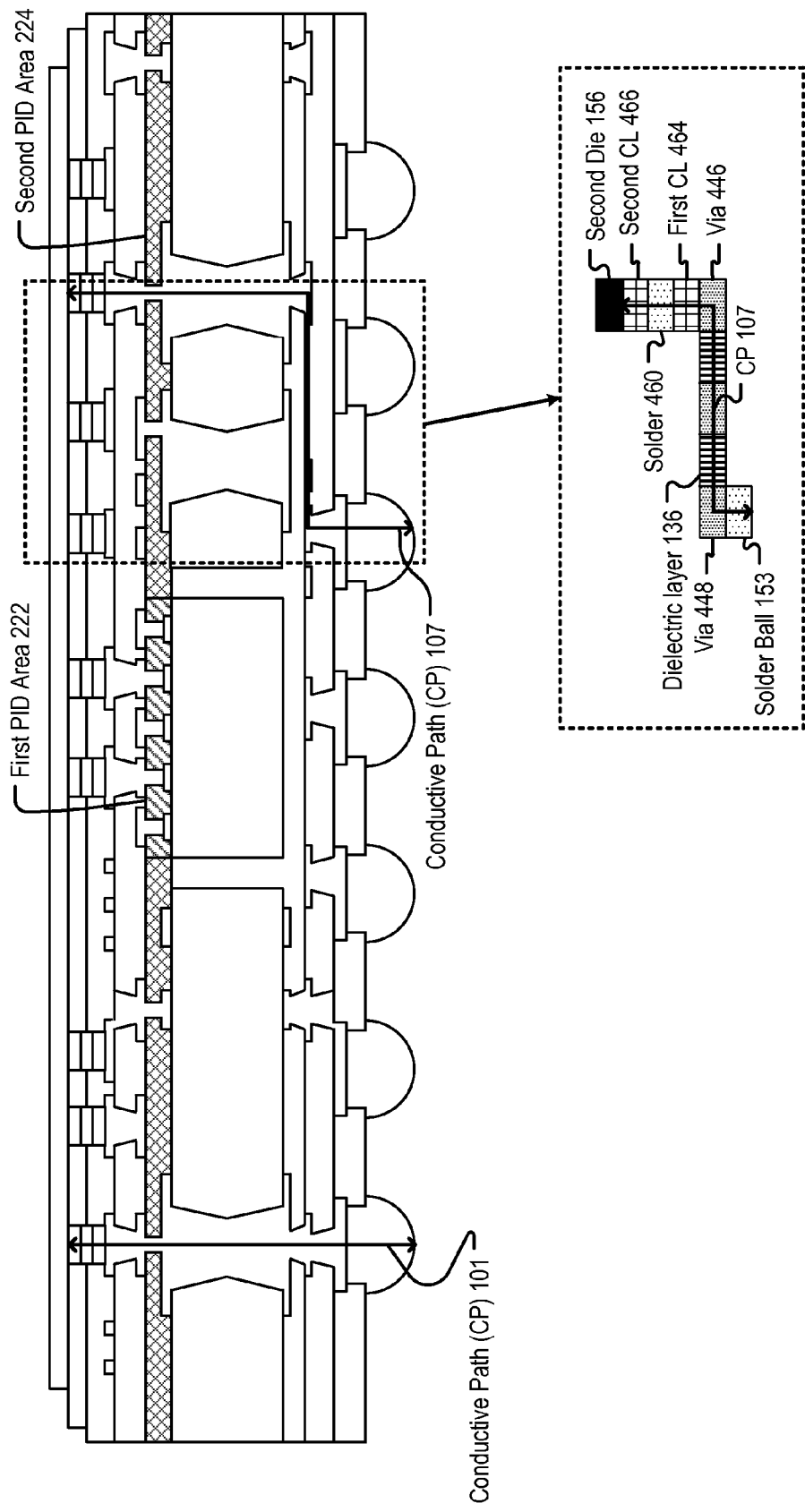
FIG. 4 is a diagram showing a side cross-sectional view of the POP structure of FIG. 1.

FIGS. 2-4, as described herein, illustrate a side cross-sectional view of the POP structure 100 of FIG. 1. Various aspects of conductive paths of the POP structure 100 are further described with reference to FIGS. 2-4.

Referring to FIG. 2, an illustrative diagram of a side cross-sectional view of the POP structure 100 is shown. The POP structure 100 may include the CP 103, the CP 162, or both.

The CP 103 may include at least one portion (e.g., the portion 113) that is perpendicular (or approximately perpendicular) to the CP 162, the CP 182, or both. The portion 113 may extend from a first end 215 to a second end 217. A first portion 208 of the CP 103 from the first die 116 to the first end 215 may be parallel (or substantially parallel) to the CP 162, the CP 182, or both. A second portion 211 of the CP 103 from the second end 217 to the second die 156 may be parallel (or substantially parallel) to the CP 162, the CP 182, or both.

The first portion 208 may extend from the first die 116, through a seed layer (SL) 219, to a via 201. The via 201 may pass through the PID layer 124. The portion 113 may extend from the via 201 at the first end 215 to a via 204 at the second end 217. The portion 113 may pass through one or more portions of the dielectric layer 136 and one or more vias between the via 201 and the via 204. The second portion 211 may extend from the via 204, through a first conductive layer (CL) 242, solder 262, and a second CL 244, to the second die 156. The second portion 211 may extend to the portion 190. The portion 190 may extend beyond the first die 116 along an axis (e.g., a horizontal axis of FIG. 2) that is parallel to the portion 113.

The CP 162 may be extend from the first die 116, through an SL 218, the via 146, a first CL 264, solder 260, and a second CL 266, to the second die 156. The CP 162 may include a straight (or substantially straight) path between the first die 116 and the second die 156. In a particular aspect, the top structure 168 of FIG. 1 may include the second CL 266.

The SL 218, the SL 219, or both, may include copper or other metal. The via 201, the via 204, the first CL 242, the second CL 244, the first CL 264, the second CL 266, or a combination thereof, may include a conductive material (e.g., copper, tin, nickel, or another metal). The solder 260, the solder 262, or both, may include a fusible metal alloy. The solder 260, the solder 262, or both, may include conductive material.

The PID layer 124 may include a first PID area 222 directly between the first die 116 and the second die 156. For example, the first PID area 222 may overlap the first die 116 along the horizontal axis of FIG. 2. The PID layer 124 may include a second PID area 224 not directly between the first die 116 and the second die 156. For example, the second PID area 224 may extend in one or both directions along the horizontal axis of FIG. 2 beyond the first die 116. To illustrate, a first portion of the second PID area 224 may extend in a first direction along the horizontal axis of FIG. 2 beyond the first die 116 and a second portion of the second PID area 224 may extend in a second direction along the horizontal axis of FIG. 2 beyond the first die 116. The second PID area 224 may be between the first die 116 and the second die 156 (e.g., along the vertical axis of FIG. 2). However, the second PID area 224 may not be directly between the first die 116 and the second die 156 because a plane perpendicular to a surface of the second PID area 224 may intersect the second die 156 and may not intersect the first die 116. The second PID area 224 may overlap the second die 156 along a horizontal axis of FIG. 2 (e.g., the PID area 224 may extend beyond the first die 116 in a direction along the horizontal axis of FIG. 2).

The CP 162, the CP 182, or both, may extend through the first PID area 222 from the first die 116 to the second die 156. The first portion 208 may extend from the first die 116 through the first PID area 222 to the first end 215. The portion 113 may extend from the first end 215 through the first PID area 222, the second PID area 224, or both, to the second end 217. The second portion 211 may extend from the second end 217 through the second PID area 224 to the second die 156.

The POP structure 100 may include multiple conductive paths between the first die 116 and the second die 156. Some of the conductive paths between the first die 116 and the second die 156 may be straight (or substantially straight). The straight conductive paths may extend directly through the PID layer from the first die 116 to the second die 156. Other conductive paths between the first die 116 and the second die 156 may include a portion that is perpendicular (or approximately) perpendicular to the straight conductive paths between the first die 116 and the second die 156. A conductive path that includes a perpendicular (or approximately perpendicular) portion may extend from the first die 116 to the portion 190 of the second die 156. The perpendicular portion may extend through an area (e.g., the second PID area 224) of the PID layer not directly between the first die 116 and the second die 156. For example, the perpendicular portion may extend through a portion of the second PID area 224 that extends beyond the first die 116 in a first direction along the horizontal axis of FIG. 2. The portion 190 may extend beyond the first die 116 along an axis (e.g., the horizontal axis of FIG. 2).

Referring to FIG. 3, an illustrative diagram of a side cross-sectional view of the POP structure 100 is shown. The POP structure 100 may include the CP 101, the CP 105, or both.

The CP 101 may extend from the solder bump (SB) 184, through a via 346, a first CL 364, solder 360, and a second CL 366, to the second die 156. The CP 101 may include a straight (or substantially straight) path from the SB 184 to the second die 156. At least a portion of the via 346 may pass through the PID layer 124 of FIG. 1. In a particular aspect, the via 346 may include multiple vias. For example, the via 346 may include a first via extending through the dielectric layer 138, a second via extending through the laminate 120, a third via extending through the core layer 110, a fourth via extending through the PID layer 124, a fifth via extending through the dielectric layer 136, or a combination thereof. The fourth via may extend through the second PID area 224.

The CP 105 may extend from the SB 151, through a via 346, the laminate 120, a via 348, one or more additional vias, one or more portions of the dielectric layer 136, a via 350, and a seed layer 318, to the first die 116. The via 350 may extend through the first PID area 222. At least a portion of the CP 105 may be perpendicular (or approximately perpendicular) to the CP 101. For example, a portion of the CP 105 from the via 350 to the via 348 may be perpendicular (or approximately perpendicular) to the CP 101. The via 348 may extend through the second PID area 224. At least a portion of the CP 105 may be parallel (or substantially parallel) to the CP 101. For example, a portion of the CP 105 from the via 350 to the first die 116 may be parallel (or substantially parallel) to the CP 101. As another example, a portion of the CP 105 from the laminate 120 to the SB 151 may be parallel (or substantially parallel) to the CP 101.

The SB 184, the SB 151, the solder 360, or a combination thereof, may include a fusible metal alloy. The via 346, the via 348, one or more additional vias, the first CL 364, the second CL 366, or a combination thereof, may include a conductive material (e.g., copper, tin, nickel, or another metal). The seed layer 318 may include copper or other metal. The solder 360 may include conductive material. The solder 360 may include a fusible metal alloy.

The POP structure 100 may include a conductive path from a die to a solder bump. For example, the POP structure 100 may include a straight (or substantially straight) conductive path from the second die 156 to a solder bump. The conductive path between the second die 156 and the solder bump may correspond to a power path or a signal path. As another example, the POP structure 100 may include a conductive path from the first die 116 to a solder bump. The conductive path between the first die 116 and the solder bump may correspond to a power path or a signal path.

Referring to FIG. 4, an illustrative diagram of a side cross-sectional view of the POP structure 100 is shown. The POP structure 100 may include the CP 107.

The CP 107 may extend from the solder ball 153, through a via 448, one or more portions of the dielectric layer 136, one or more additional vias, a via 446, a first CL 464, solder 460, and a second CL 466, to the second die 156. At least a portion of the via 446 may pass through the PID layer 124 of FIG. 1. At least a portion of the CP 107 may be parallel (or substantially parallel) to the CP 101. For example, a portion of the CP 107 extending from the via 448 to the solder ball 153 may be parallel (or substantially parallel) to the CP 101. As another example, a portion of the CP 107 extending from the via 446 to the second die 156 may be parallel (or substantially parallel) to the CP 101. At least a portion of the CP 107 may be perpendicular (or approximately perpendicular) to the CP 101. For example, a portion of the CP 107 extending from the via 448 to the via 446 may be perpendicular (or approximately perpendicular) to the CP 101. In a particular aspect, the via 446 may include multiple vias. For example, the via 446 may include a first via extending through the laminate 120, a second via extending through the core layer 110, a third via extending through the PID layer 124, a fourth via extending through the dielectric layer 136, or a combination thereof. The third via may extend through the second PID area 224. The via 448 may extend through the dielectric layer 138.

The solder ball 153, the solder 460, or both, may include a fusible metal alloy. The via 448, one or more additional vias, the via 446, or a combination thereof, may include a conductive material (e.g., copper, tin, nickel, or another metal). The solder 460 may include a fusible metal alloy. The solder 460 may include conductive material.

The POP structure 100 may include multiple conductive paths from a die to solder bumps. For example, the POP structure 100 may include a conductive path from the second die 156 to a solder bump. The conductive path between the second die 156 and the solder bump may correspond to a power path or a signal path. The conductive path may include a straight (or substantially) straight path between the second die 156 and the solder bump. Alternatively, the conductive path may include a portion that is perpendicular (or approximately perpendicular) to a straight conductive path between the second die 156 and another solder bump.

FIGS. 5-17, as described herein, illustrate a side cross-sectional view of structures formed during particular stages of fabrication of the POP structure 100 of FIG. 1. In a particular aspect, each structure illustrated in FIGS. 5-17 is formed during particular stages of fabricating an electronic device (e.g., a semiconductor device). The electronic device may include the POP structure 100.

Figure 5:
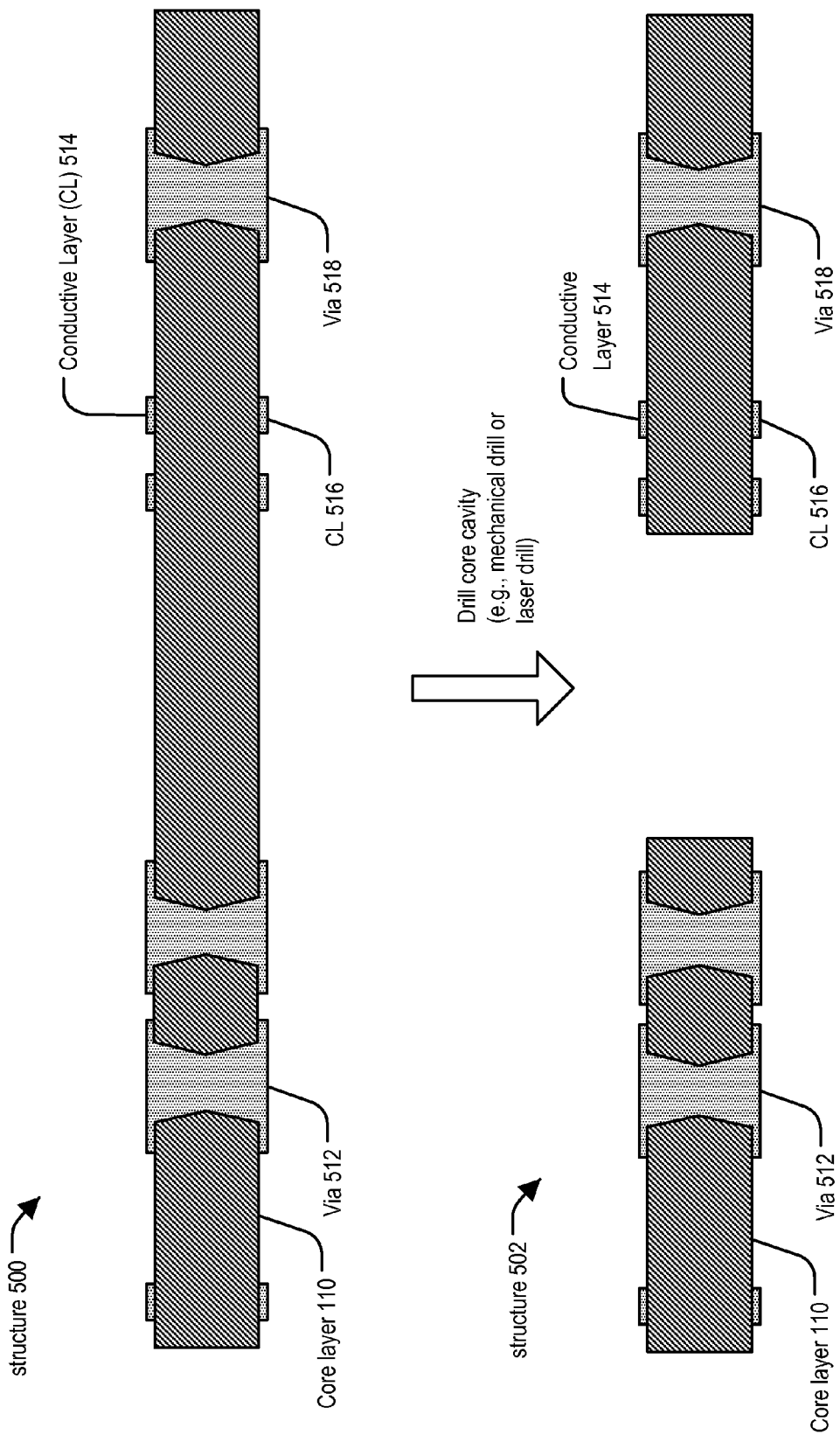
FIG. 5 is a diagram showing a side cross-sectional view of a structure formed during at least one stage of fabrication of the POP structure of FIG. 1.

Referring to FIG. 5, an illustrative diagram of a side cross-sectional view of a structure is shown and generally designated 500. The structure 500 may be formed during at least one stage in a process of fabrication of the POP structure 100 of FIG. 1. In a particular aspect, the structure 500 may be pre-fabricated. The structure 500 may include the core layer 110 of FIG. 1. The core layer 110 may include one or more vias (e.g., a via 512, a via 518, or both). The one or more vias (e.g., the via 512, the via 518, or both) may include copper or other metal. A surface of the core layer 110 may include one or more conductive layers (e.g., a CL 514, a CL 516, or both). The one or more conductive layers (e.g., the CL 514, the CL 516, or both) may include copper or other metal. A structure 502 may be formed by drilling a cavity in the core layer 110. For example, the cavity may be formed by mechanical or laser drilling.

Figure 6:
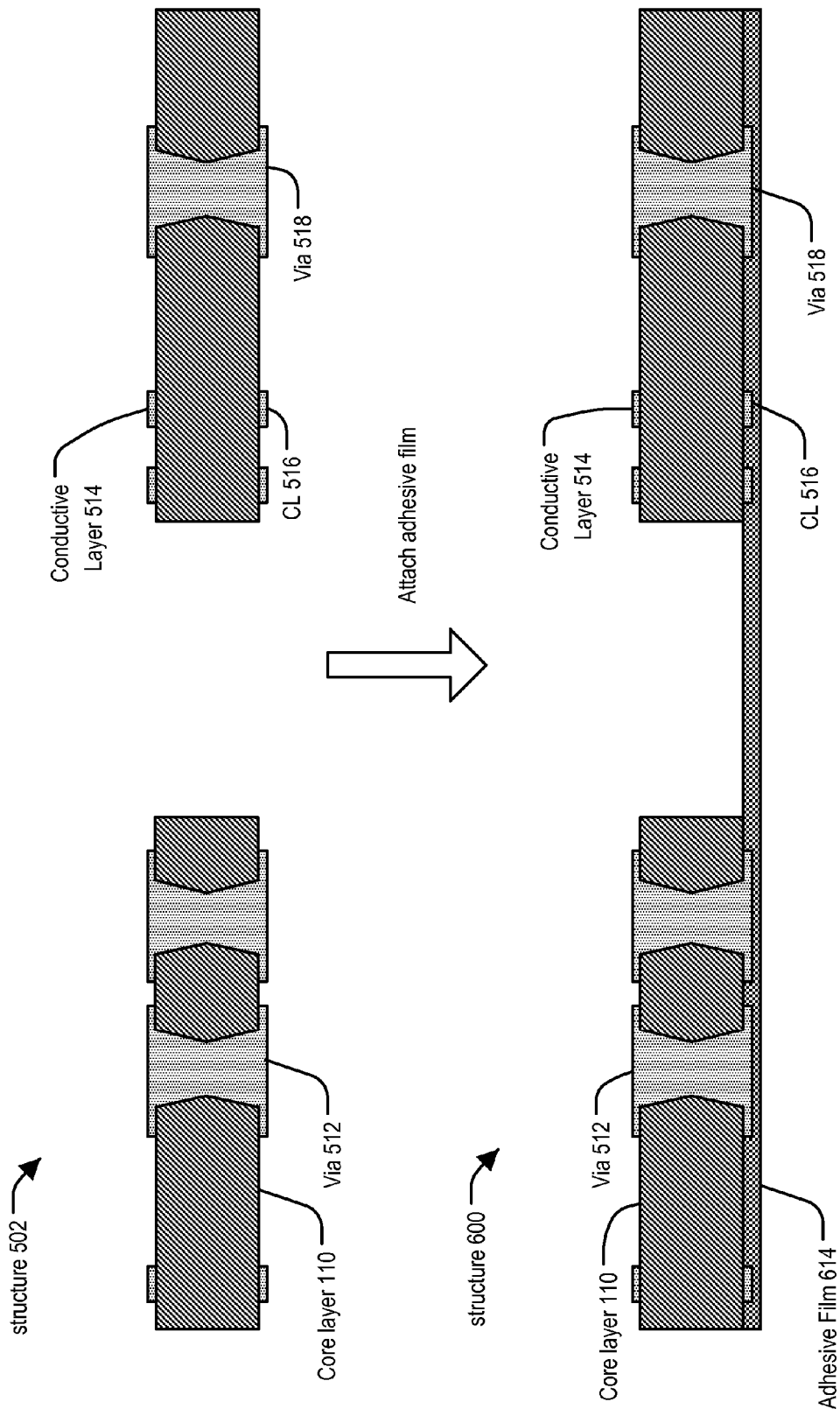
FIG. 6 is a diagram showing a side cross-sectional view of a structure formed during at least one stage of fabrication of the POP structure of FIG. 1.

Referring to FIG. 6, an illustrative diagram of a side cross-sectional view of a structure is shown and generally designated 600. The structure 600 may be formed during at least one stage in a process of fabrication of the POP structure 100 of FIG. 1. The structure 600 may be formed by attaching an adhesive film 614 to the structure 502 of FIG. 5. For example, the adhesive film 614 may be attached to the core layer 110 such that remaining portions of the core layer 110 are spaced apart on the adhesive film 614. The adhesive film 614 may include an adhesive tape (e.g., a polyethylene tape) or an epoxy adhesive.

Figure 7:
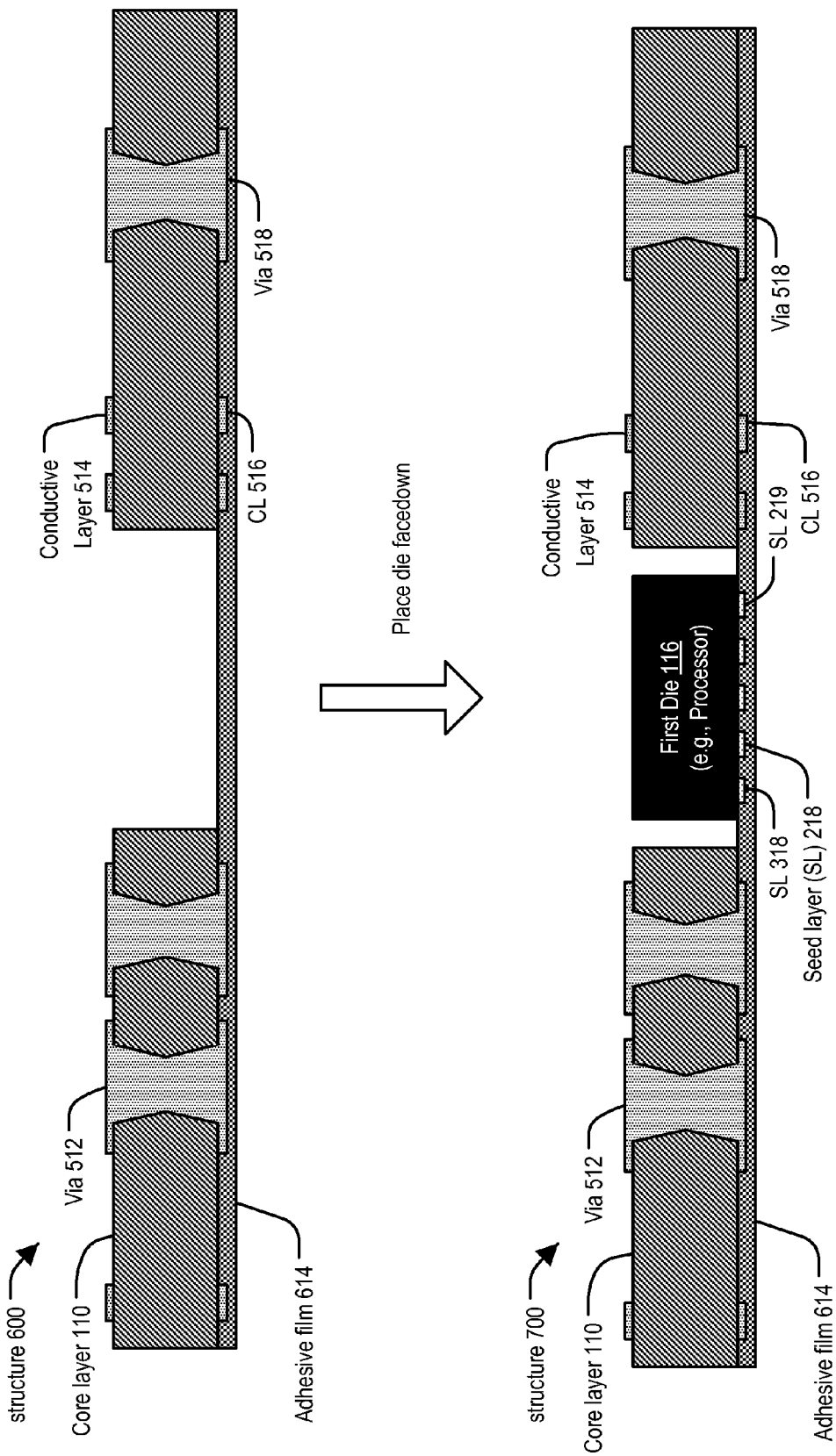
FIG. 7 is a diagram showing a side cross-sectional view of a structure formed during at least one stage of fabrication of the POP structure of FIG. 1.

Referring to FIG. 7, an illustrative diagram of a side cross-sectional view of a structure is shown and generally designated 700. The structure 700 may be formed during at least one stage in a process of fabrication of the POP structure 100 of FIG. 1. The structure 700 may be formed by placing the first die 116 on the structure 600 of FIG. 6. For example, the first die 116 may be placed face-down on the adhesive film 614 in a gap formed by the remaining portions of the core layer 110. One or more seed layers (e.g., the seed layer (SL) 218, the SL 219, the SL 318, or a combination thereof) may be attached to the first die 116. Placing the first die 116 on the adhesive film 614 may include placing the one or more seed layers (e.g., the SL 118, the SL 219, the SL 318, or a combination thereof) on the adhesive film 614 prior to placing the first die 116 on the one or more seed layers and the adhesive film 614.

Figure 8:
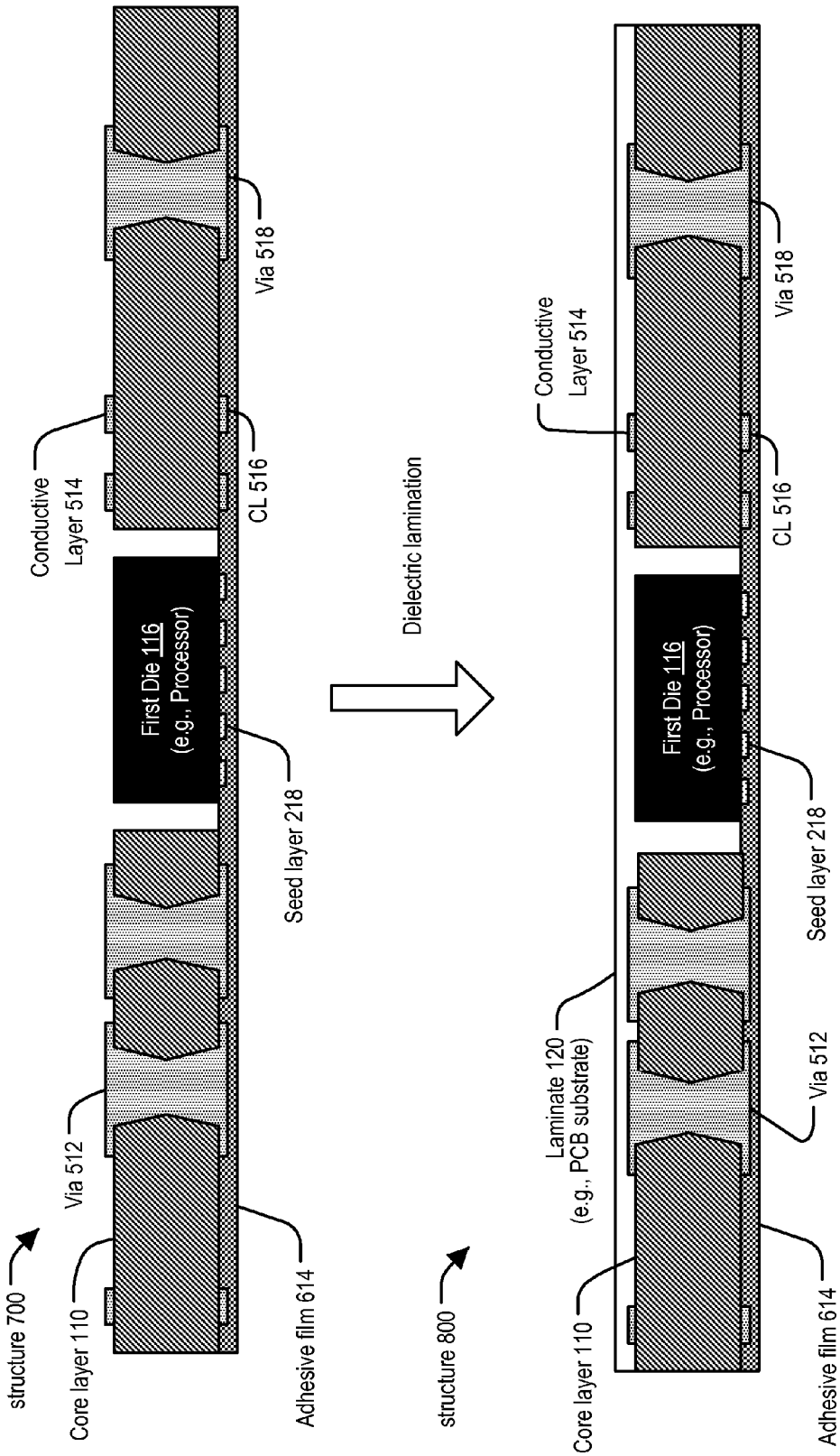
FIG. 8 is a diagram showing a side cross-sectional view of a structure formed during at least one stage of fabrication of the POP structure of FIG. 1.

Referring to FIG. 8, an illustrative diagram of a side cross-sectional view of a structure is shown and generally designated 800. The structure 800 may be formed during at least one stage in a process of fabrication of the POP structure 100 of FIG. 1. The structure 800 may be formed by laminating the structure 700 of FIG. 7. For example, the laminate 120 may be deposited on the structure 700 subsequent to placing the first die 116 on the adhesive film 614. The laminate 120 may be deposited in a liquid state on the core layer 110 and the first die 116. The laminate 120 may fill one or more gaps between the first die 116 and the core layer 110. The laminate 120 may transition to a solid state. For example, heat may be applied to the structure 800 to solidify the laminate 120.

Figure 9:
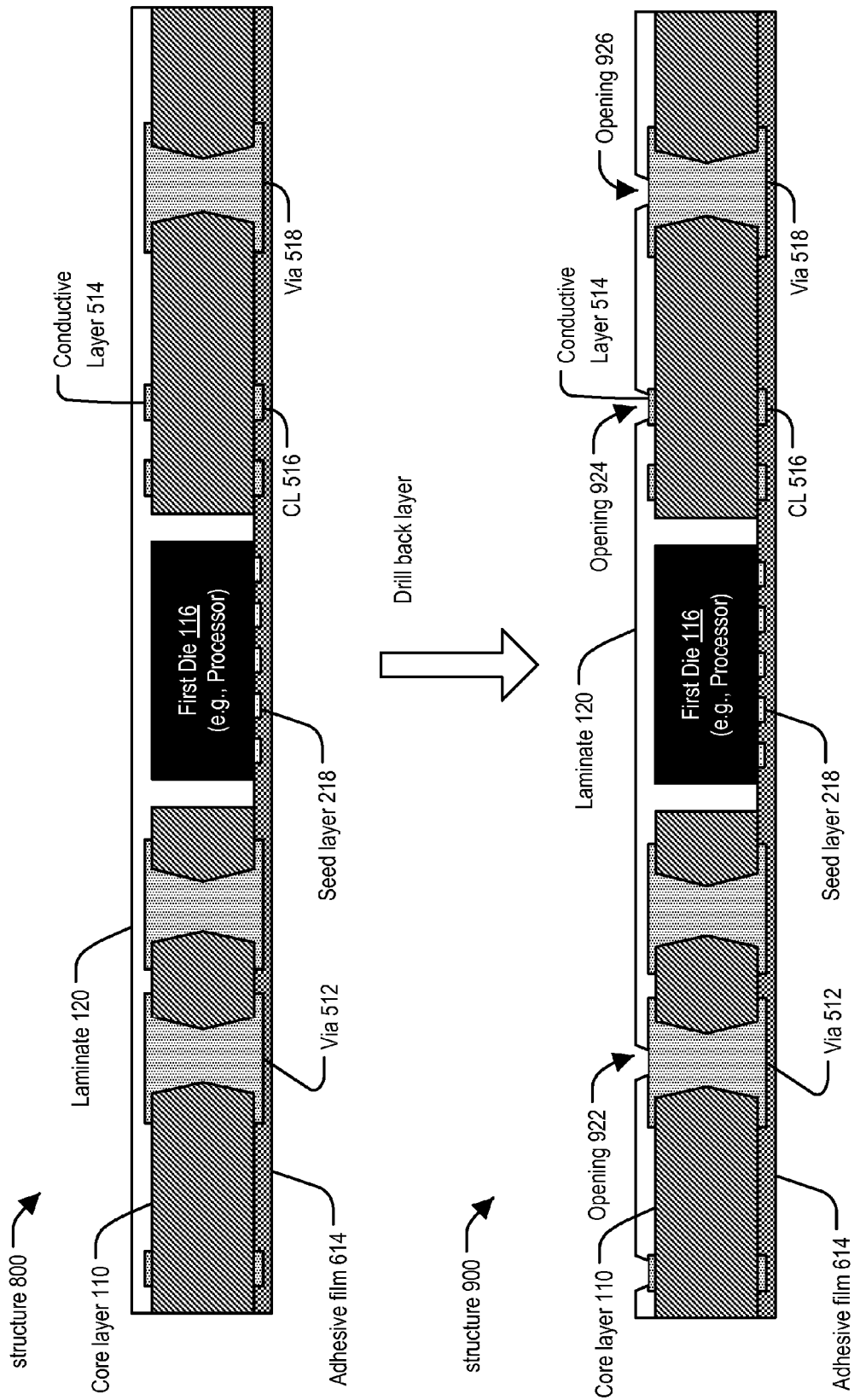
FIG. 9 is a diagram showing a side cross-sectional view of a structure formed during at least one stage of fabrication of the POP structure of FIG. 1.

Referring to FIG. 9, an illustrative diagram of a side cross-sectional view of a structure is shown and generally designated 900. The structure 900 may be formed during at least one stage in a process of fabrication of the POP structure 100 of FIG. 1. The structure 900 may be formed by drilling the structure 800 of FIG. 8. For example, portions of the laminate 120 may be drilled to form one or more openings (e.g., an opening 922, an opening 924, an opening 926, or a combination thereof). The opening 922 may be formed on (e.g., aligned with) the via 512. The opening 924 may be formed on (or aligned with) the conductive layer 514. The opening 926 may be formed on (e.g., aligned with) the via 518.

Figure 10:
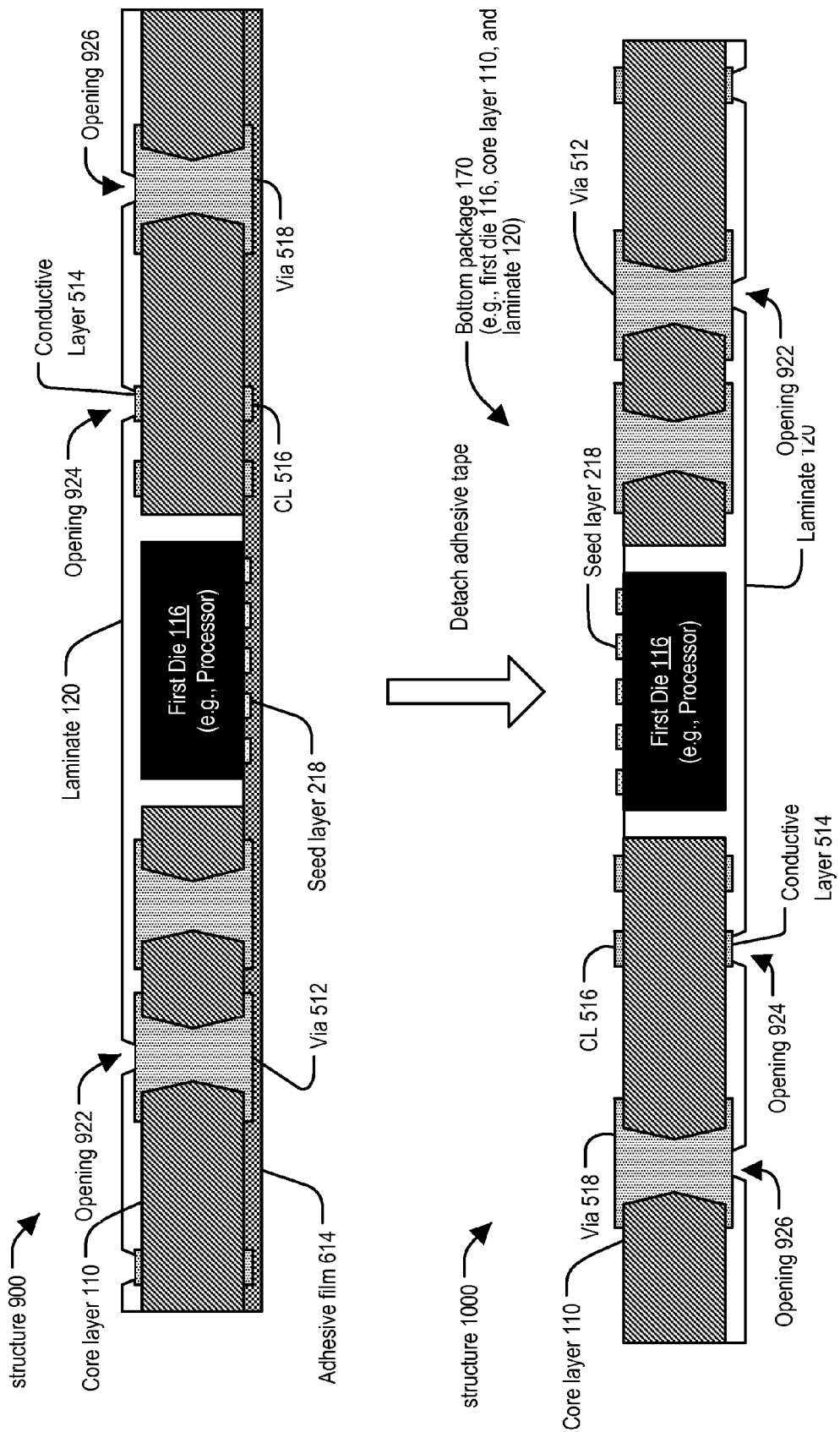
FIG. 10 is a diagram showing a side cross-sectional view of a structure formed during at least one stage of fabrication of the POP structure of FIG. 1.

Referring to FIG. 10, an illustrative diagram of a side cross-sectional view of a structure is shown and generally designated 1000. The structure 1000 may be formed during at least one stage in a process of fabrication of the POP structure 100 of FIG. 1. The structure 1000 may be formed by removing the adhesive film 614 from the structure 900 of FIG. 9. In a particular aspect, the adhesive film 614 may be pulled off. In an alternate aspect, an adhesive remover (e.g., an epoxy solvent) may be applied to the structure 900 to remove the adhesive film 614. In a particular aspect, the adhesive film 614 may be removed prior to forming one or more vias (e.g., the opening 922, the opening 924, the opening 926, or a combination thereof) of FIG. 9. For example, the adhesive film 614 may be removed from the structure 800 of FIG. 8 and the opening 922 may be formed subsequent to removing the adhesive film 614. The structure 1000 may be turned upside-down (e.g., rotated 180 degrees) subsequent to (or prior to) removing the adhesive film 614.

Figure 11:
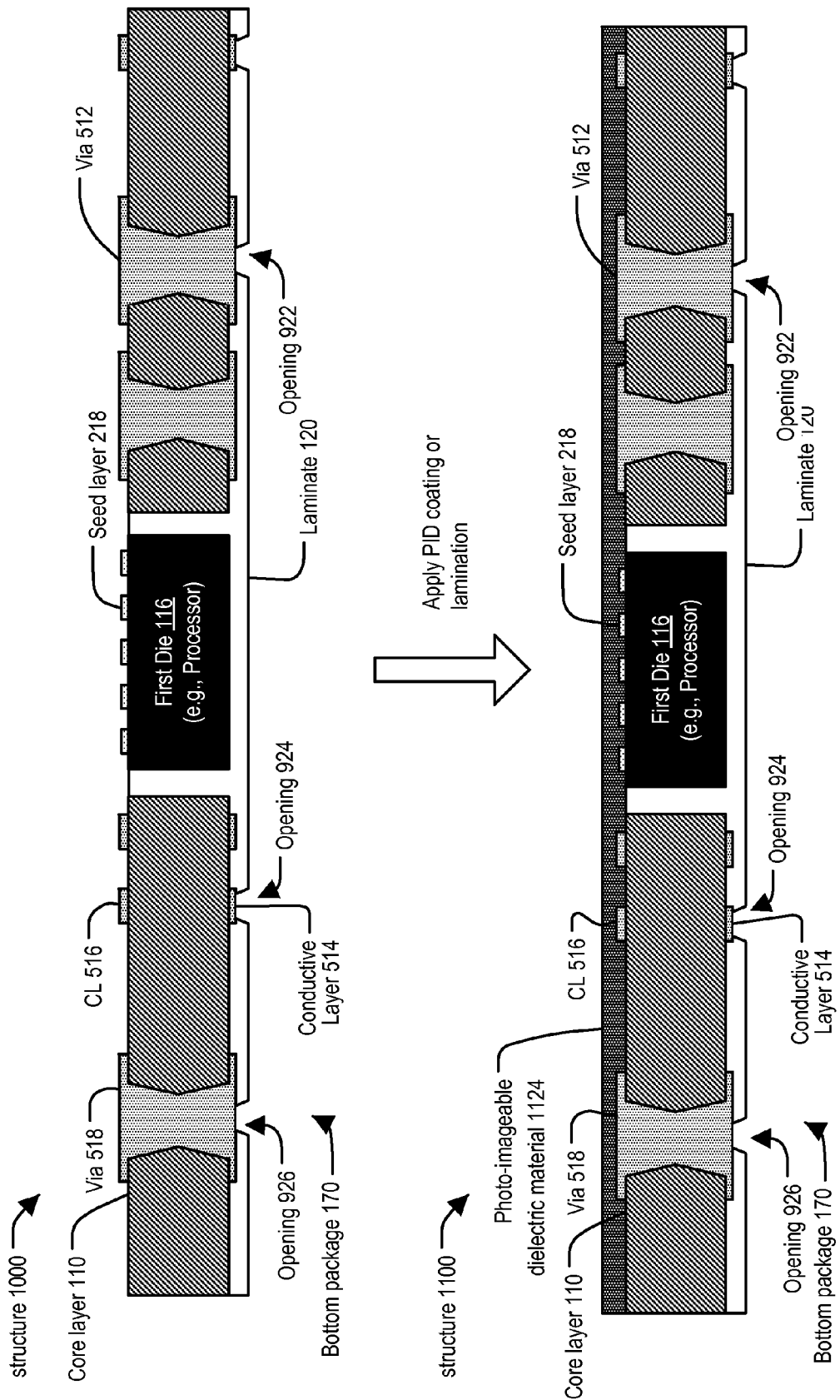
FIG. 11 is a diagram showing a side cross-sectional view of a structure formed during at least one stage of fabrication of the POP structure of FIG. 1.

Referring to FIG. 11, an illustrative diagram of a side cross-sectional view of a structure is shown and generally designated 1100. The structure 1100 may be formed during at least one stage in a process of fabrication of the POP structure 100 of FIG. 1. The structure 1100 may be formed by depositing photo-imageable dielectric material 1124 on the structure 1000 of FIG. 10. For example, the photo-imageable dielectric material 1124 may be deposited on the core layer 110 and on the first die 116 subsequent to removing the adhesive film 614. In a particular aspect, the bottom structure 170 may include the core layer 110 and the first die 116. The bottom structure 170 may be pre-fabricated. The photo-imageable dielectric material 1124 may be deposited on the bottom structure 170.

In a particular aspect, the PID layer 124 of FIG. 1 may include a spin-on dielectric (SOD) layer. For example, the photo-imageable dielectric material 1124 may be dissolved in a solvent and spin-coated on the core layer 110 and the first die 116. The solvent may be removed by baking and furnace curing to form the PID layer 124. In an alternate aspect, the photo-imageable dielectric material 1124 may be applied using chemical vapor deposition (CVD).

Figure 12:
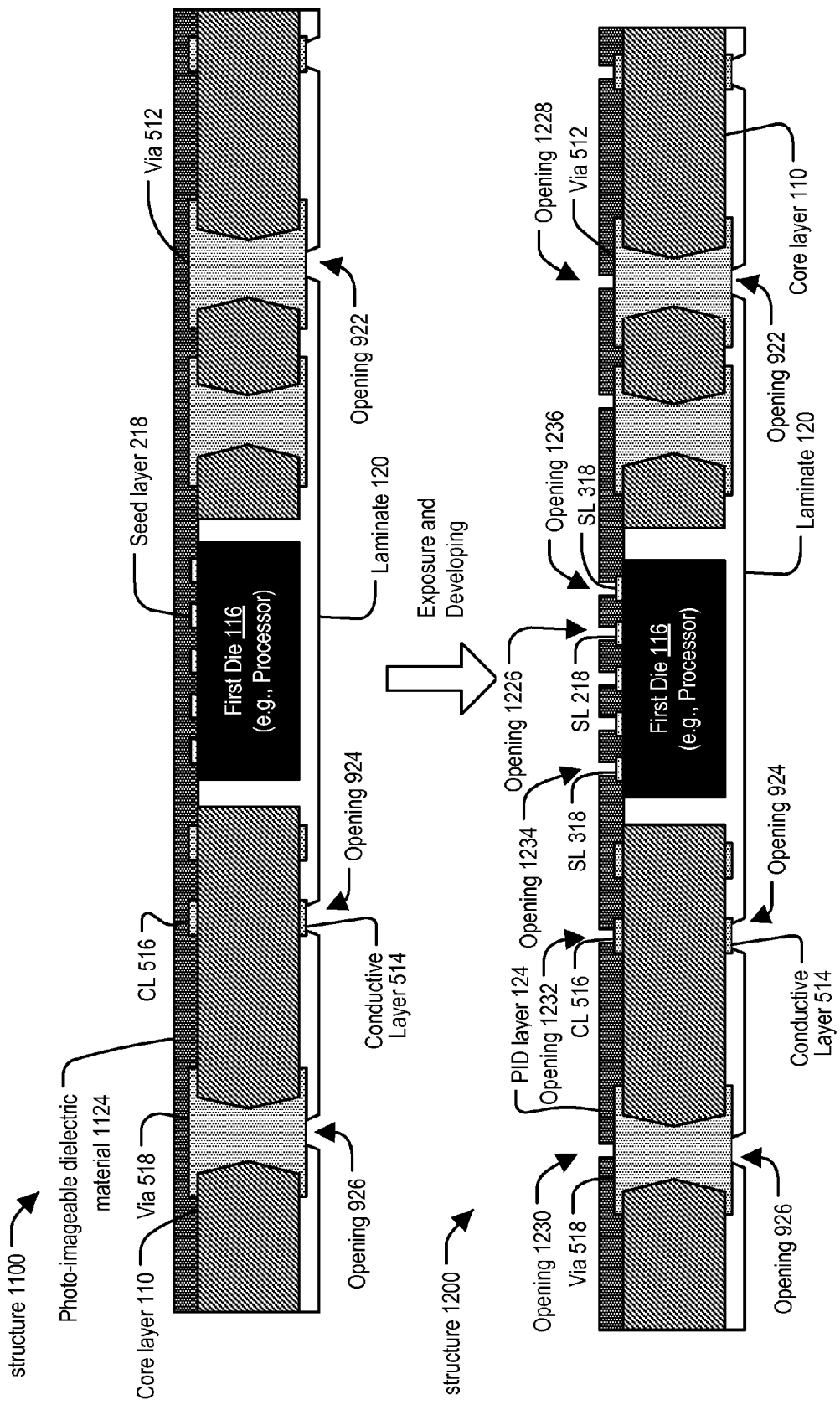
FIG. 12 is a diagram showing a side cross-sectional view of a structure formed during at least one stage of fabrication of the POP structure of FIG. 1.

Referring to FIG. 12, an illustrative diagram of a side cross-sectional view of a structure is shown and generally designated 1200. The structure 1200 may be formed during at least one stage in a process of fabrication of the POP structure 100 of FIG. 1. The structure 1200 may be formed by exposing and developing the photo-imageable dielectric material 1124 of the structure 1100 of FIG. 1. The photo-imageable dielectric material 1124 may be patterned to form the PID layer 124. For example, the photo-imageable dielectric material 1124 may be exposed to ultraviolet light through a photomask. The unexposed regions may be removed by applying a developer. Portions of the PID layer 124 may be removed using lithography to form one or more openings. To illustrate, portions of the PID layer 124 may be removed to form an opening 1226, an opening 1228, an opening 1230, an opening 1232, an opening 1234, an opening 1236, or a combination thereof. The opening 1226 may expose at least a portion of the the seed layer 218. The opening 1228 may be formed on (or aligned with) the via 512. The opening 1230 may be formed on (or aligned with) the via 518. The opening 1230 may be formed on (or aligned with) the opening 926. The opening 1232 may be formed on (or aligned with) the CL 516. The opening 1234 may expose at least a portion of the seed layer 318. The opening 1236 may expose at least a portion of the seed layer 318.

Figure 13:
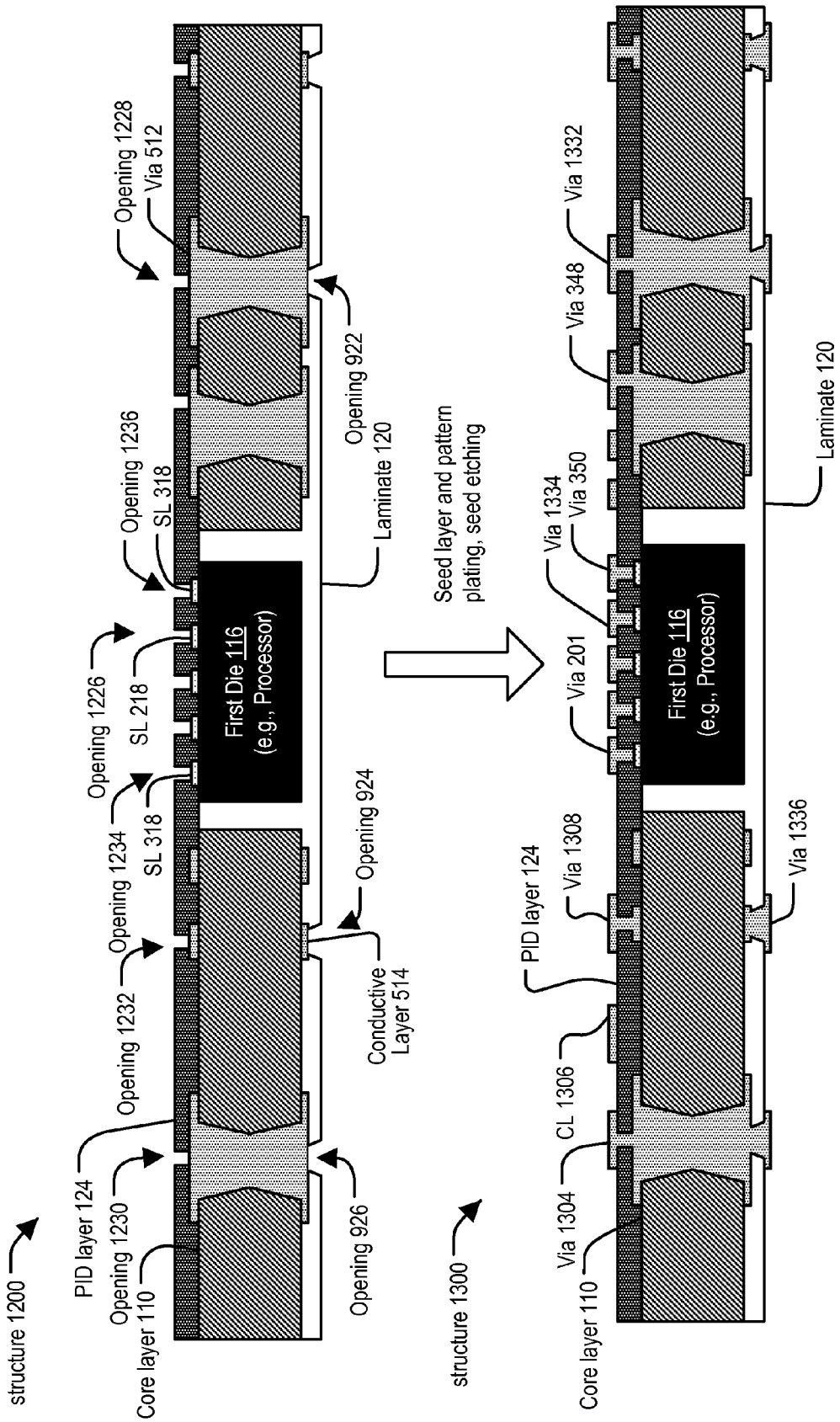
FIG. 13 is a diagram showing a side cross-sectional view of a structure formed during at least one stage of fabrication of the POP structure of FIG. 1.

Referring to FIG. 13, an illustrative diagram of a side cross-sectional view of a structure is shown and generally designated 1300. The structure 1300 may be formed during at least one stage in a process of fabrication of the POP structure 100 of FIG. 1. The structure 1300 may be formed by filling one or more vias of the structure 1200 of FIG. 12 with a conductive material (e.g., copper or other metal). For example, the opening 1228 and the opening 922 may be filled with a conductive material (e.g., copper) to form a via 1332. The via 1332 may pass through the structure 1600. As another example, the opening 1226 may be filled with a conductive material (e.g., copper) to form a via 1334. The via 1334 may be electrically coupled to the first die 116 via the seed layer 218. As an additional example, the opening 924 may be filled with a conductive material (e.g., copper) to form a via 1336. The opening 1236 may be filled with a conductive material (e.g., copper) to form the via 350. The opening 1234 may be filled with a conductive material (e.g., copper) to form the via 201. The opening 1232 may be filled with a conductive material (e.g., copper) to form a via 1308. The opening 1230 and the opening 926 may be filled with a conductive material (e.g., copper) to form a via 1304. Some of the conductive material may overflow from the opening 1230, the opening 1232, the opening 1234, the opening 1226, the opening 1236, the opening 1228, or a combination thereof, to form one or more conductive pads on the PID layer 124. Some of the conductive material may overflow from the opening 926, the opening 924, the opening 922, or a combination thereof, to form one or more conductive pads on a surface of the laminate 120.

Figure 14:
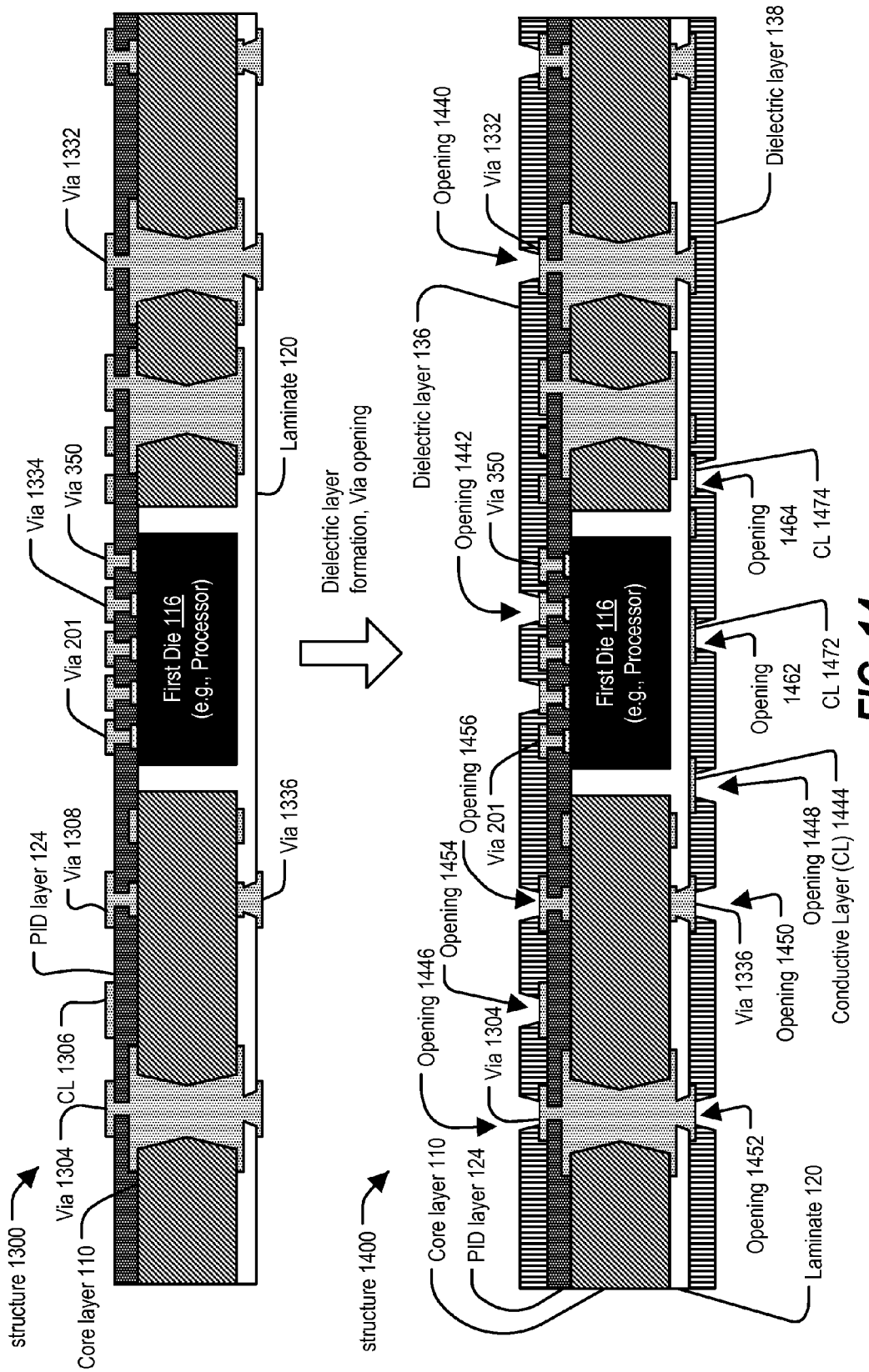
FIG. 14 is a diagram showing a side cross-sectional view of a structure formed during at least one stage of fabrication of the POP structure of FIG. 1.

Referring to FIG. 14, an illustrative diagram of a side cross-sectional view of a structure is shown and generally designated 1400. The structure 1400 may be formed during at least one stage in a process of fabrication of the POP structure 100 of FIG. 1. The structure 1400 may be formed by depositing one or more dielectric layers on the structure 1300 of FIG. 13. For example, the dielectric layer 136 may be deposited on the PID layer 124. As another example, the dielectric layer 138 may be deposited on the laminate 120. In a particular aspect, one or more conductive layers (e.g., a CL 1444, a CL 1472, a CL 1474, or a combination thereof) may be deposited on the laminate 120 prior to depositing the dielectric layer 138.

Portions of the dielectric layer 136, the dielectric layer 138, or both, may be removed (e.g., etched) to form openings. One or more openings (e.g., an opening 1440, an opening 1442, an opening 1446, an opening 1456, or a combination thereof) of the dielectric layer 136 may be aligned with vias of the PID layer 124. For example, the opening 1440 may be formed on (or aligned with) the via 1332. As another example, the opening 1442 may be formed on (or aligned with) the via 1334. The opening 1442 may be aligned with the seed layer 218. The opening 1446 may be formed on (or aligned with) the via 1304. The opening 1456 may be formed on (or aligned with) the via 1308. One or more openings (e.g., an opening 1454) of the dielectric layer 136 may be formed on (or aligned with) conductive layers disposed on the PID layer 124. For example, the opening 1454 may be formed on (or aligned with) the CL 1306. An opening may be formed by applying a mask to a first dielectric layer (e.g., the dielectric layer 136 or the dielectric layer 138). The mask may be patterned to expose a particular area of the first dielectric layer. The particular area may be aligned with another portion of a structure (e.g., the structure 1400). For example, the mask may expose an area of the dielectric layer 136 that is aligned with the CL 1306. The particular area of the first dielectric layer may be removed (e.g., etched).

One or more openings (e.g., an opening 1448, an opening 1462, an opening 1464, or a combination thereof) of the dielectric layer 138 may be aligned with conductive layers disposed on the laminate 120. For example, the opening 1448 may be formed on (or aligned with) the conductive layer 1444. The opening 1462 may be formed on (or aligned with) the CL 1472. The opening 1464 may be formed on (or aligned with) the CL 1474. One or more openings (e.g., an opening 1452, an opening 1450, or both) of the dielectric layer 138 may be aligned with vias of the laminate 120. For example, the opening 1450 may be formed on (or aligned with) the via 1336. The opening 1452 may be formed on (or aligned with) the via 1304.

Figure 15:
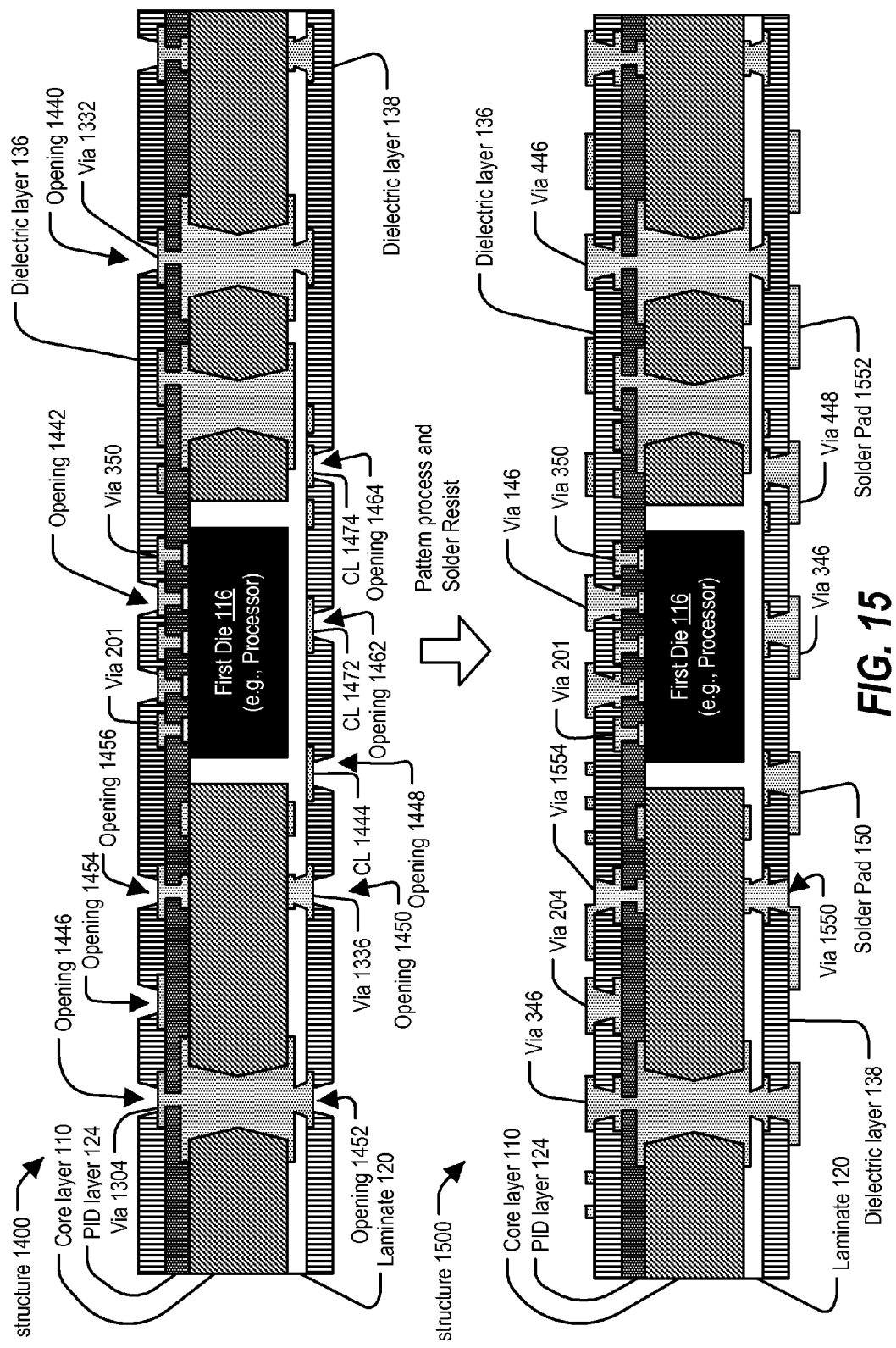
FIG. 15 is a diagram showing a side cross-sectional view of a structure formed during at least one stage of fabrication of the POP structure of FIG. 1.

Referring to FIG. 15, an illustrative diagram of a side cross-sectional view of a structure is shown and generally designated 1500. The structure 1500 may be formed during at least one stage in a process of fabrication of the POP structure 100 of FIG. 1. The structure 1500 may be formed by filling one or more vias of the dielectric layer 136, one or more vias of the dielectric layer 138, or a combination thereof, with a conductive material (e.g., copper). For example, the opening 1442 may be filled with a conductive material (e.g., copper) to form the via 146. The via 146 may pass through the dielectric layer 136 and the PID layer 124 to the seed layer 218. As another example, the opening 1440 may be filled with a conductive material (e.g., copper) to form the via 446. The opening 1446 and the opening 1452 may be filled with a conductive material (e.g., copper) to form the via 346. The opening 1454 may be filled with a conductive material (e.g., copper) to form the via 204. The opening 1456 may be filled with a conductive material (e.g., copper) to form the via 1554. Some of the conductive material may overflow from the opening 1440, the opening 1442, the opening 1446, the opening 1454, the opening 1456, or a combination thereof, such that one or more conductive pads are formed on a surface of the dielectric layer 136. In a particular implementation, the conductive material may fill the opening 1440, the opening 1442, the opening 1446, the opening 1454, the opening 1456, or a combination thereof, and form a layer on the surface of the dielectric layer 136. Portions of the layer of the conductive material may be removed (e.g., etched) to form the one or more conductive pads.

The opening 1448 may be filled with a conductive material (e.g., copper) to form the solder pad 150. To illustrate, some of the conductive material may overflow to form the solder pad 150 on a surface of the dielectric layer 138. As another example, the opening 1450 may be filled with a conductive material (e.g., copper) to form a via 1550. The opening 1462 may be filled with a conductive material (e.g., copper) to form the via 346. The opening 1464 may be filled with a conductive material (e.g., copper) to form the via 448.

Conductive material (e.g., copper) may be deposited on the dielectric layer 138 to form one or more solder pads (e.g., a solder pad 1552). In a particular aspect, the conductive material (e.g., copper) may be deposited on the dielectric layer 138. The conductive material may fill the opening 1448, the opening 1450, the opening 1452, the opening 1462, the opening 1464, or a combination thereof. Portions of the conductive material may be removed (e.g., etched) to form the solder pad 150, the solder pad 1552, a solder pad corresponding to the via 346, a solder pad corresponding to the via 346, a solder pad corresponding to the via 448, or a combination thereof.

Figure 16:
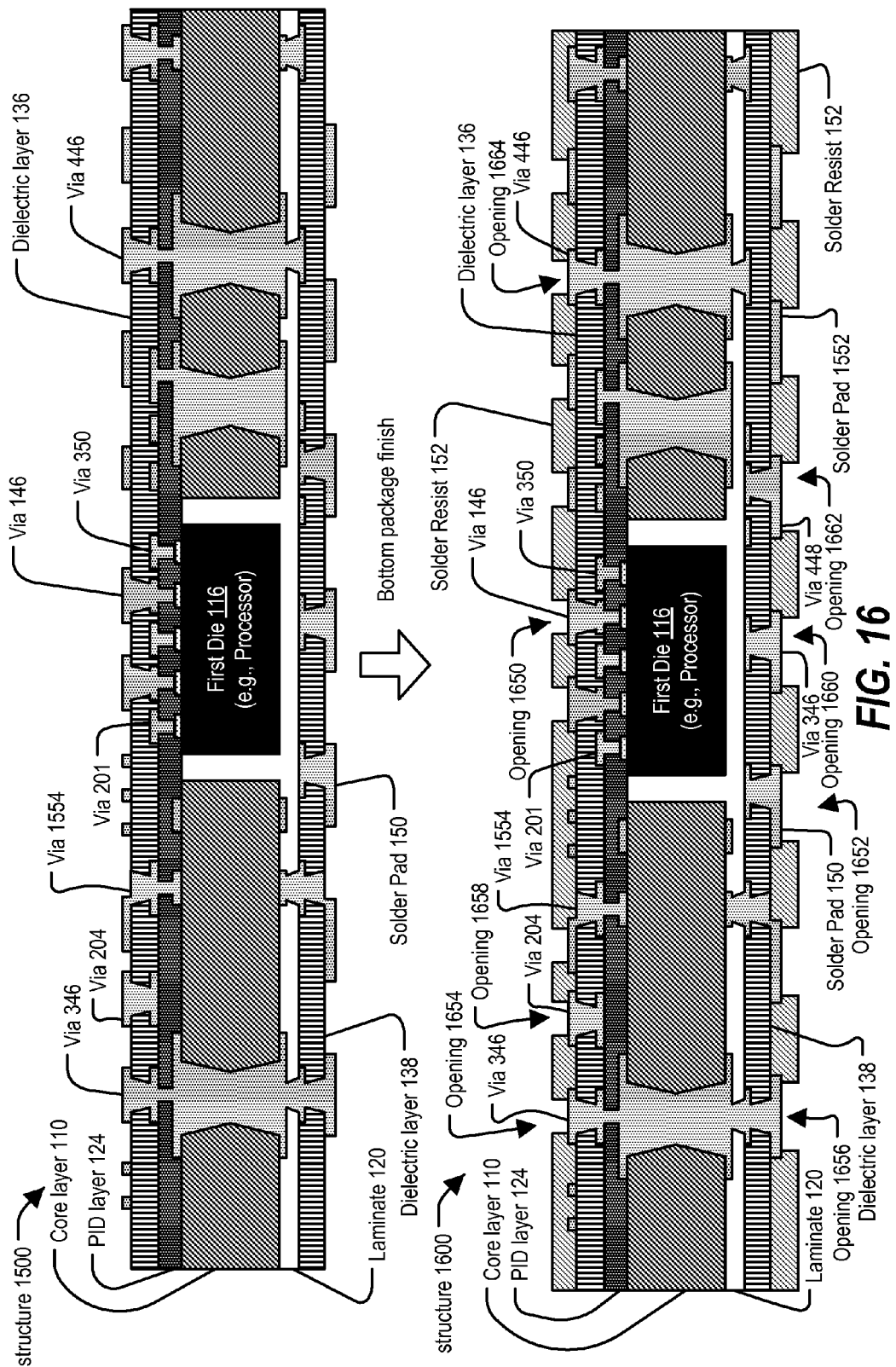
FIG. 16 is a diagram showing a side cross-sectional view of a structure formed during at least one stage of fabrication of the POP structure of FIG. 1.

Referring to FIG. 16, an illustrative diagram of a side cross-sectional view of a structure is shown and generally designated 1600. The structure 1600 may be formed during at least one stage in a process of fabrication of the POP structure 100 of FIG. 1. The structure 1600 may be formed by depositing solder resist 152 on the structure 1500 of FIG. 15. For example, the solder resist 152 may be deposited on the dielectric layer 136, the dielectric layer 138, or both. Portions of the solder resist 152 may be removed (e.g., etched) to form openings such that one or more vias (e.g., the via 346, the via 204, the via 146, the via 446, the via 346, the via 448, or a combination thereof) are uncovered and one or more solder pads (e.g., the solder pad 150, the solder pad 1552, or both) are uncovered. For example, an opening 1650 may be formed on (or aligned with) the via 146. As another example, an opening 1652 may be formed on (or aligned with) the solder pad 150. An opening 1654 and an opening 1656 may be formed on (or aligned with) the via 346. The opening 1654 and the opening 1656 may be on opposite sides of the via 346. An opening 1658 may be formed on (or aligned with) the via 204. An opening 1664 may be formed on (or aligned with) the via 446. An opening 1660 may be formed on (or aligned with) the via 346. An opening 1662 may be formed on (or aligned with) the via 448.

Figure 17:
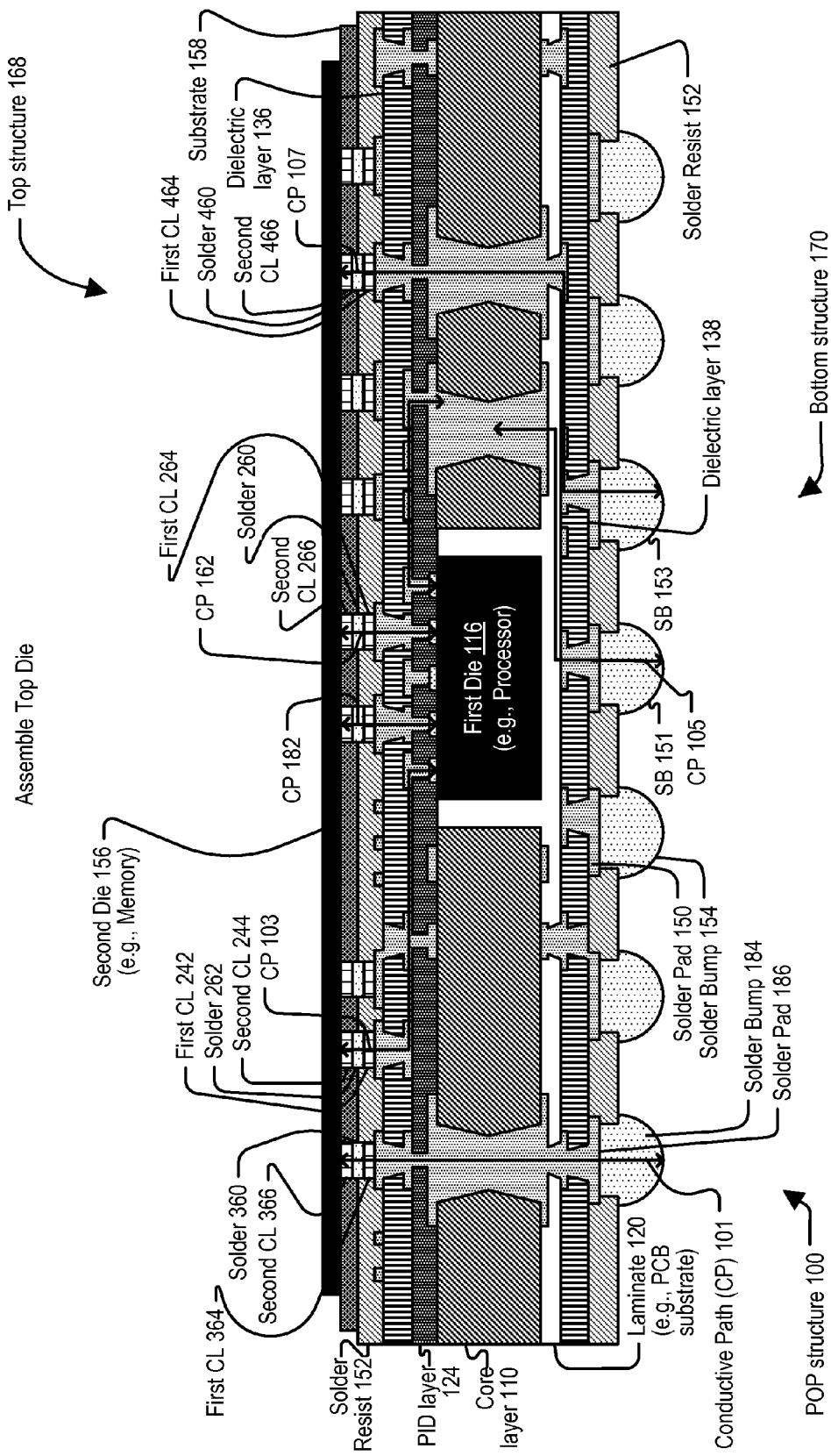
FIG. 17 is a diagram showing a side cross-sectional view of a structure formed during at least one stage of fabrication of the POP structure of FIG. 1.

Referring to FIG. 17, an illustrative diagram of a side cross-sectional view of the POP structure 100 is shown. The POP structure 100 may be formed by partially filling one or more openings of the structure 1600 of FIG. 16 with conductive material (e.g., copper). For example, the opening 1650 may be partially filled with a conductive material (e.g., copper) to form the first conductive layer 264. The opening 1664 may be partially filled with a conductive material (e.g., copper) to form the first CL 464. The opening 1658 may be partially filled with a conductive material (e.g., copper) to form the first CL 242. The opening 1654 may be partially filled with a conductive material (e.g., copper) to form the first CL 364.

One or more solder bumps (or solder balls) may be deposited on the structure 1600. For example, the solder bump 154 may be placed on the solder pad 150. A portion of the opening 1656 may correspond to the solder pad 186. The solder bump 184 may be placed on the solder pad 186. The solder bump 151 may be placed on a portion of the via 346 that corresponds to a solder pad. The solder bump 153 is placed on a portion of the via 448 that corresponds to a solder pad.

Solder material (e.g., solder paste) may be deposited on the conductive material disposed in openings of the solder resist 152. For example, the solder 260, the solder 460, the solder 262, and the solder 360 may be deposited on the first conductive layer 264 in the opening 1650, the first CL 464 in the opening 1664, the first CL 242 in the opening 1658, and the first CL 364 in the opening 1654, respectively. Substrate material (e.g., a non-conductive paste) may be applied on the solder resist 152 to form the substrate 158.

A conductive material may be disposed on portions of the second die 156 to form one or more second conductive layers. For example, the second CL 244, the second CL 266, the second CL 366, the second CL 466, or a combination thereof, may be disposed on the second die 156. One or more conductive paths may be formed between the top structure 168 and the bottom structure 170. For example, the second die 156 may be placed on the substrate 158 such that the conductive material disposed on the second die 156 is aligned with the solder material. To illustrate, the second die 156 may be placed on the substrate 158 such that the second CL 244 is aligned with the solder 262, the second CL 266 is aligned with the solder 260, the second CL 366 is aligned with the solder 360, the second CL 466 is aligned with the solder 460, or a combination thereof.

Placing the second die 156 on the substrate 158 may move a portion of the substrate material (e.g., the non-conductive paste) that is between the conductive material (e.g., the second CL 244, the second CL 266, the second CL 366, the second CL 466, or a combination thereof) and the solder material (e.g., the solder 262, the solder 260, the solder 360, the solder 460, or a combination thereof) to sides of the conductive material and the solder material. In a particular aspect, portions of the substrate material may be removed (e.g., by etching) to expose the conductive material (e.g., the second CL 244, the second CL 266, the second CL 366, the second CL 466, or a combination thereof) prior to placing the second die 156 on the substrate 158.

Reflow soldering may be performed after placing the second die 156 on the substrate 158. Subsequent to the reflow solder the first conductive layer 264 may be attached (e.g., soldered) to the second conductive layer 266 via the solder 260, the first CL 464 may be attached to the second CL 466 via the solder 460, the first CL 242 may be attached to the second CL 244 via the solder 262, the first CL 364 may be attached to the second CL 366 via the solder 360, or a combination thereof. Subsequent to the reflow solder the solder bump 154 may be attached (e.g., soldered) to the solder pad 150, the solder bump 184 may be attached (e.g., soldered) to the solder pad 186, the solder bump 151 may be attached to a portion of the via 346 that corresponds to a solder pad, the solder bump 153 may be attached to a portion of the via 448 that corresponds to a solder pad, or a combination thereof.

In a particular aspect, the top structure 168 may include the second die 156, the substrate 158, the second conductive layer 266, the second CL 366, the second CL 244, the second CL 466, or a combination thereof. The top structure 168 may be pre-fabricated. The POP structure 100 may be formed by placing the solder 260 on the first conductive layer 264, the solder 460 on the first CL 464, the solder 262 on the first CL 242, the solder 360 on the first CL 364. The top structure 168 may be placed such that the second conductive layer 266 is placed on the solder 260, the second CL 466 is placed on the solder 460, the second CL 244 is placed on the solder 262, the second CL 366 is placed on the solder 360, or a combination. Reflow soldering may be performed subsequent to placing the top structure 168.

The POP structure 100 may include the conductive path 162 from the first die 116, via the seed layer 218, the via 146, the first conductive layer 264, the solder 260, and the second conductive layer 266, to the second die 156. The via 146 may pass through the PID layer 124. The conductive path 162 may be straight (or substantially straight). The POP structure 100 may include the conductive path 101 from the second die 156, via the second CL 366, the solder 360, the first CL 364, and the via 346, to the solder bump 184. The conductive path 101 may be straight (or substantially straight). The conductive path 101 may be parallel (or substantially parallel) to the conductive path 162.

The POP structure 100 may include the conductive path 103 from the second die 156, via the second CL 244, the solder 262, the first CL 242, the via 204, one or more portions of the dielectric layer 138, one or more additional vias, the via 201, and the seed layer 219, to the first die 116. The POP structure 100 may include the conductive path 105 from the first die 116, via the seed layer 318, the via 350, one or more portions of the dielectric layer 138, one or more additional conductive layers, the via 348, the laminate 120, and the via 346, to the solder bump 151.

A dielectric layer (e.g., the dielectric layer 136 or the dielectric layer 138) may include one or more first vias. The first vias may be filled with a conductive material (e.g., a copper). A conductive path (e.g., the conductive path 103, the conductive path 105, or the conductive path 107) that extends through the dielectric layer may extend through the first vias. A laminate (e.g., the laminate 120) may include one or more second vias. The second vias may be filled with a conductive material (e.g., a copper). A conductive path (e.g., the conductive path 105) that extends through the laminate 120 may extend through the second vias.

The POP structure 100 may include the conductive path 107 from the second die 156, via the second CL 466, the solder 460, the first CL 464, the via 446, one or more portions of the dielectric layer 138, one or more additional conductive layers, and the via 448, to the solder bump 153.

The POP structure 100 formed as described with reference to FIGS. 5-17 may include one or more conductive paths between the first die 116 and the second die 156 through the PID layer 124. For example, the POP structure 100 may include the conductive path 162. The conductive path 162 may extend from the first die 116, through the seed layer 218, the via 146, the first conductive layer 264, the solder 260, and the second conductive layer 266, to the second die 156. The via 146 may pass through the PID layer 124.

Figure 18:
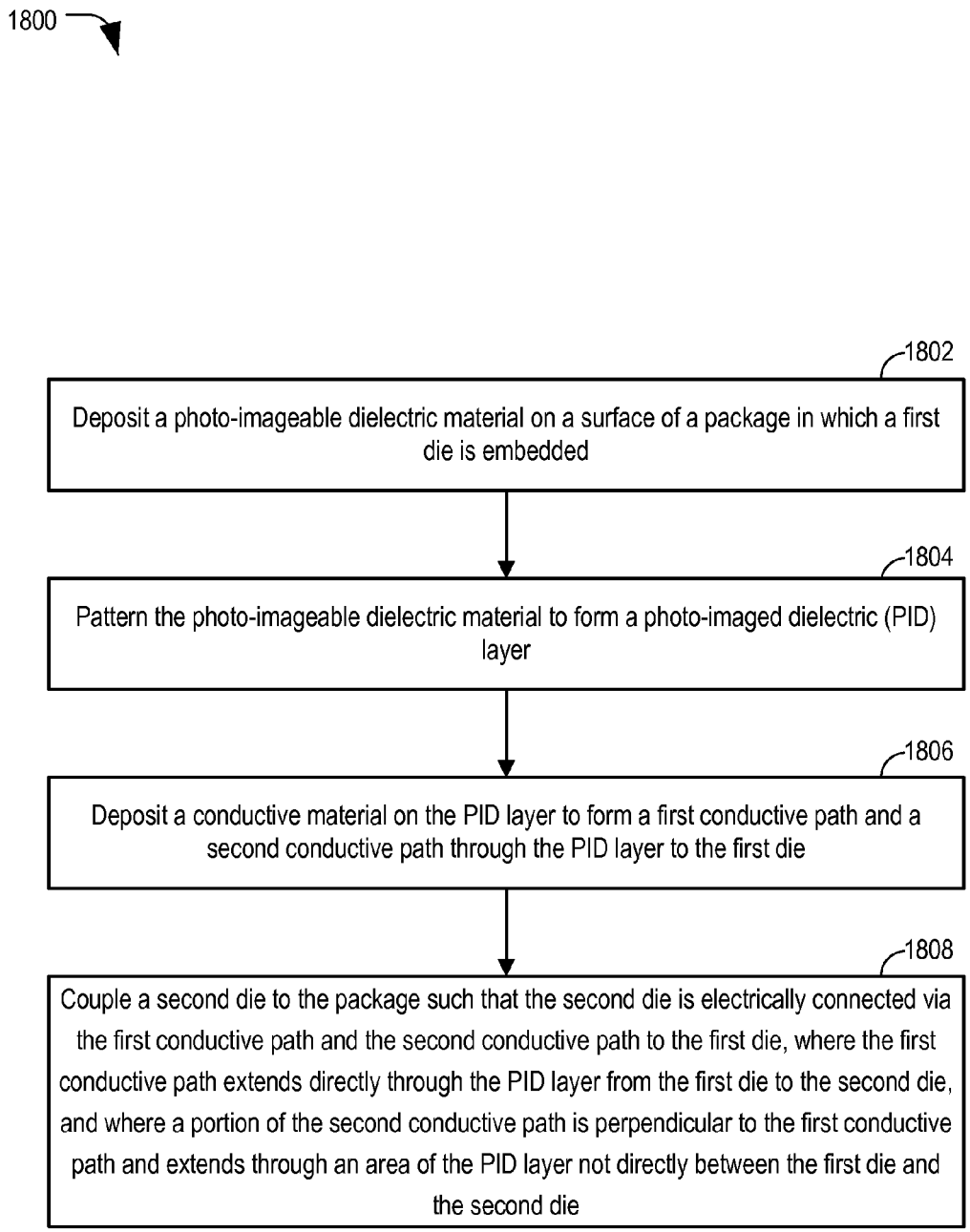
FIG. 18 is a flow chart of a particular illustrative aspect of a method of forming the POP structure of FIG. 1.

FIG. 18 is a flow chart illustrating a particular aspect of a method 1800 of forming the POP structure 100 of FIG. 1. The method 1800 includes depositing a photo-imageable dielectric material on a surface of a package in which a first die is embedded, at 1802. For example, the POP structure 100 of FIG. 1 may be formed by depositing the photo-imageable dielectric material 1124 on the structure 1000, as described with reference to FIG. 11. The first die 116 may be embedded in the structure 1000, as described with reference to FIGS. 5-10.

The method 1800 also includes patterning the photo-imageable dielectric material to form a photo-imaged dielectric (PID) layer, at 1804. For example, forming the POP structure 100 of FIG. 1 may include patterning the photo-imageable dielectric material 1124 to form the PID layer 124, as described with reference to FIG. 12.

The method 1800 further includes depositing a conductive material on the PID layer to form a first conductive path and a second conductive path through the PID layer to the first die, at 1806. For example, forming the POP structure 100 of FIG. 1 may include depositing conductive material to form the conductive path 162 and the conductive path 103 through the PID layer 124, as described with reference to FIGS. 13-17.

The method 1800 also includes coupling a second die to the package such that the second die is electrically connected via the first conductive path and the second conductive path to the first die, at 1808. For example, the POP structure 100 may be formed by coupling the second die 156 to the bottom structure 170 such that the second die 156 is electrically connected to the first die 116 via the conductive path 162 and the conductive path 103, as described with reference to FIG. 17. The conductive path 162 may extend directly through the PID layer 124 from the first die 116 to the second die 156. For example, the conductive path 162 may extend from the first die 116, through the first PID area 222, to the second die 156, as described with reference to FIG. 2. The portion 113 of the conductive path 103 may be perpendicular (or approximately perpendicular) to the conductive path 162 and may extend through the second PID area 224 of the PID layer 124 not directly between the first die 116 and the second die 156, as described with reference to FIG. 2. For example, the portion 113 of the conductive path 103 may extend through the first PID area 222, the second PID area 224, or both.

Figure 19:
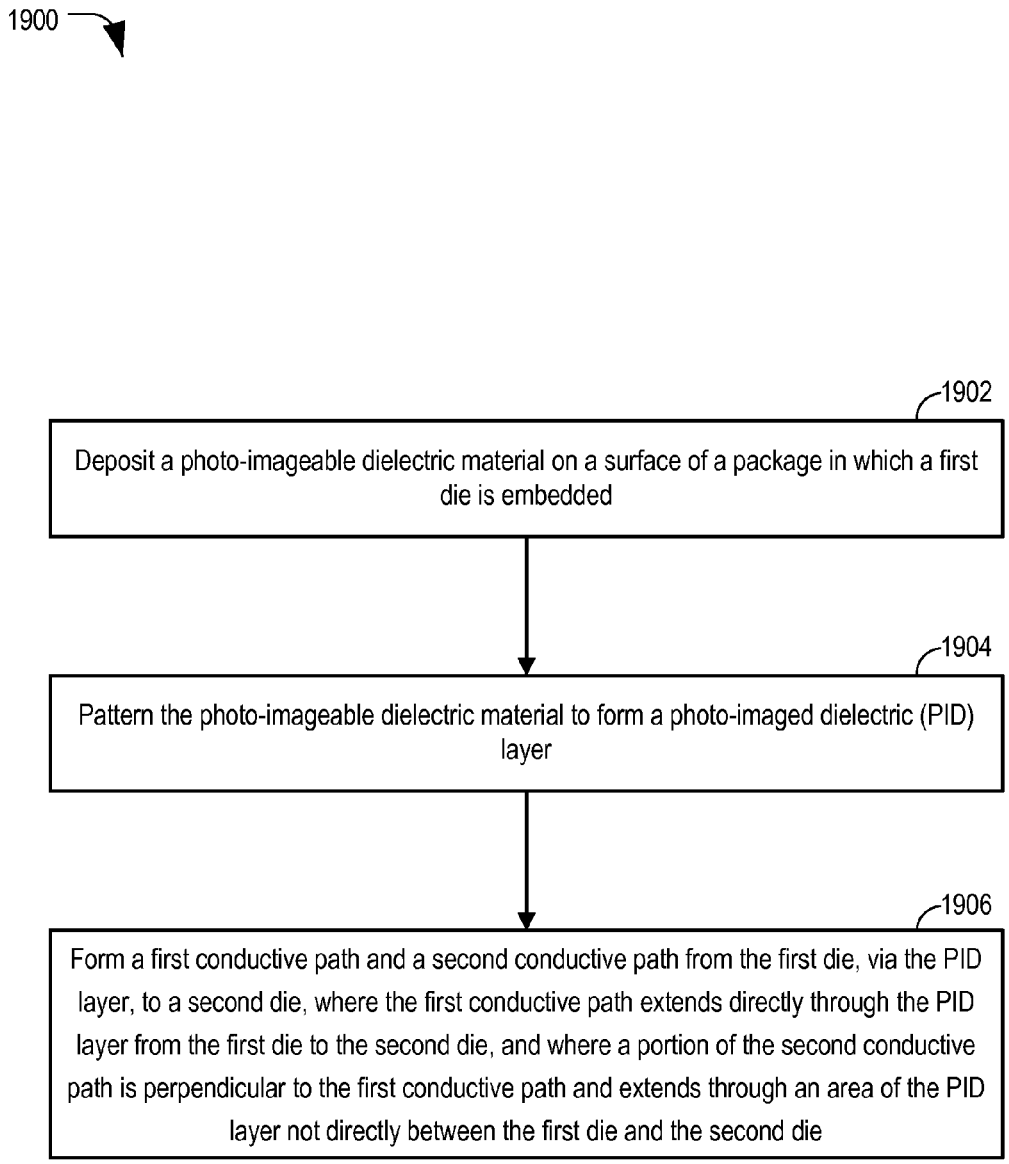
FIG. 19 is a flow chart of another aspect of a method of forming the POP structure of FIG. 1.

FIG. 19 is a flow chart illustrating another aspect of a method of forming the POP structure 100 of FIG. 1. The method 1900 includes depositing a photo-imageable dielectric material on a surface of a package in which a first die is embedded, at 1902. For example, the POP structure 100 of FIG. 1 may be formed by depositing the photo-imageable dielectric material 1124 on the structure 1000, as described with reference to FIG. 11. The first die 116 may be embedded in the structure 1000, as described with reference to FIGS. 5-10.

The method 1900 also includes patterning the photo-imageable dielectric material to form a photo-imaged dielectric (PID) layer, at 1904. For example, the POP structure 100 of FIG. 1 may be formed by patterning the photo-imageable dielectric material 1124 to form the PID layer 124, as described with reference to FIG. 12.

The method 1900 further includes forming a first conductive path and a second conductive path from the first die, via the PID layer, to a second die, at 1906. For example, the POP structure 100 of FIG. 1 may be formed by forming the conductive path 162 and the conductive path 103 from the first die 116, via the PID layer 124, to the second die 156. The conductive path 162 may extend directly through the PID layer 124 from the first die 116 to the second die 156, as described with reference to FIG. 2. For example, the conductive path 162 may extend from the first die 116, through the first PID area 222, to the second die 156, as described with reference to FIG. 2. The portion 113 of the conductive path 103 may be perpendicular (or approximately perpendicular) to the conductive path 162 and may extend through the second PID area 224 of the PID layer 124 not directly between the first die 116 and the second die 156, as described with reference to FIG. 2. For example, the portion 113 of the conductive path 103 may extend through the first PID area 222, the second PID area 224, or both.

Figure 20:
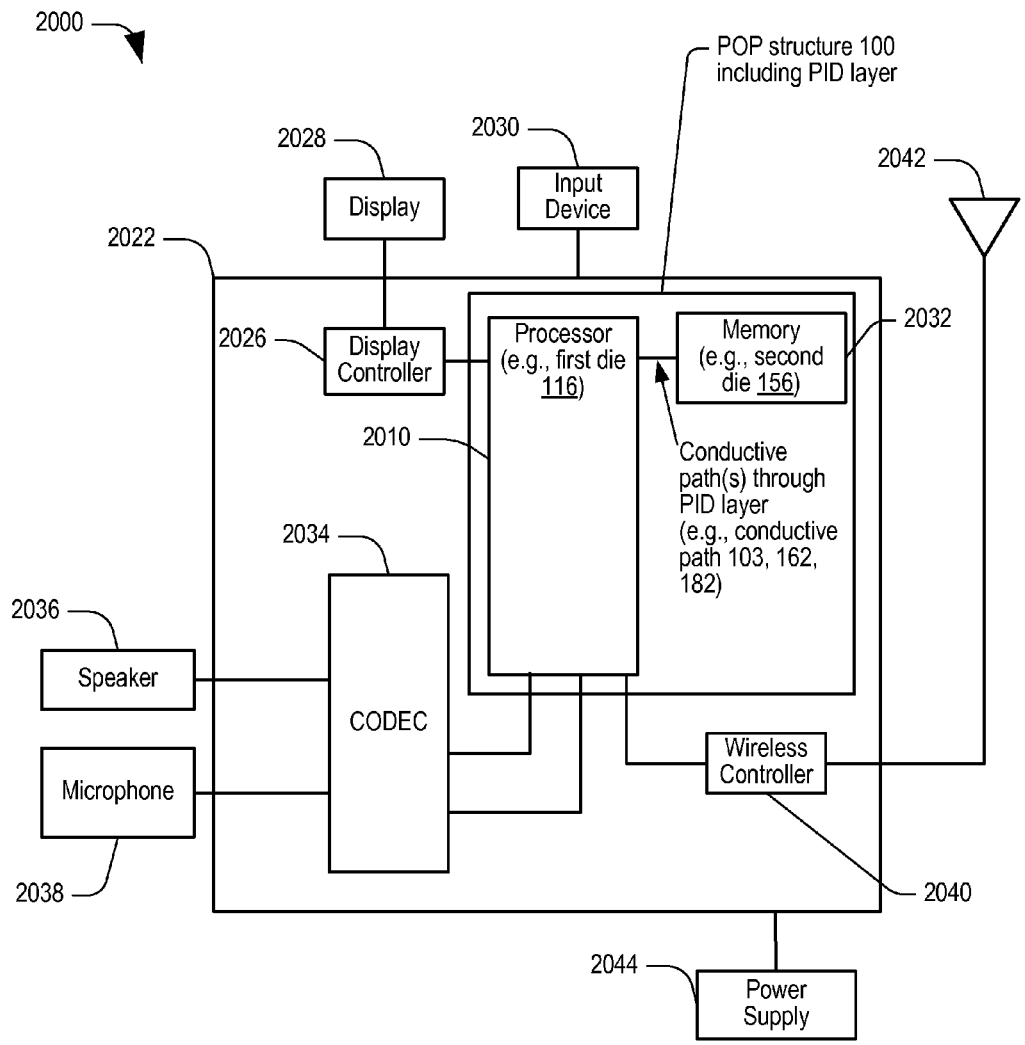
FIG. 20 is a block diagram of an electronic device including a POP structure.

Referring to FIG. 20, a block diagram of a particular illustrative aspect of an electronic device is depicted and generally designated 2000. The device 2000 includes a processor 2010, such as a digital signal processor (DSP), coupled to a memory 2032. In a particular aspect, the processor 2010 may correspond to the first die 116 of FIG. 1, and the memory 2032 may correspond to the second die 156. For example, the device 2000 may include the POP structure 100 of FIG. 1. The first die 116 may be included in or coupled to the processor 2010. The second die 156 may be included in or coupled to the memory 2032. The processor 2010 may be coupled to the memory 2032. For example, the POP structure 100 may include one or more conductive paths (e.g., the conductive path 103, the conductive path 162, the conductive path 182, or a combination thereof) between the processor 2010 and the memory 2032. In an illustrative aspect, the POP structure 100 may be formed according to one or more of the methods or operations described with reference to FIGS. 5-19.

FIG. 20 also shows a display controller 2026 that is coupled to the processor 2010 and to a display 2028. A coder/decoder (CODEC) 2034 can also be coupled to the processor 2010. A speaker 2036 and a microphone 2038 can be coupled to the CODEC 2034.

FIG. 20 also indicates that a wireless controller 2040 can be coupled to the processor 2010 and to an antenna 2042. In a particular aspect, the processor 2010, the display controller 2026, the memory 2032, the CODEC 2034, and the wireless controller 2040 are included in a system-in-package 2022. In a particular aspect, an input device 2030 and a power supply 2044 are coupled to the system-in-package device 2022. Moreover, in a particular aspect, as illustrated in FIG. 20, the display 2028, the input device 2030, the speaker 2036, the microphone 2038, the antenna 2042, and the power supply 2044 are external to the system-in-package device 2022. However, each of the display 2028, the input device 2030, the speaker 2036, the microphone 2038, the antenna 2042, and the power supply 2044 can be coupled to a component of the system-in-package device 2022, such as an interface or a controller.

In conjunction with the described aspects, an apparatus is disclosed that may include first means for packaging a first integrated circuit IC that includes a first die and a photo-imaged dielectric (PID) layer. For example, the first means for packaging may include the bottom structure 170 of FIG. 1, one or more other devices or circuits configured to package an IC and a PID layer, or a combination thereof.

The apparatus may also include second means for packaging a second IC that includes a second die. For example, the second means for packaging may include the top structure 168 of FIG. 1, one or more other devices or circuits configured to package an IC, or a combination thereof. The conductive path 162 from the first die 116 through the PID layer 124 to the second die 156 may extend directly through the PID layer 124 from the first die 116 to the second die 156. The portion 113 of the conductive path 103 from the first die 116 through the PID layer 124 to the second die 156 may be perpendicular (or approximately perpendicular) to the conductive path 162 and may extend through the second PID area 224 of the PID layer 124 not directly between the first die 116 and the second die 156.

The foregoing disclosed devices and functionalities may be designed and configured into computer files (e.g. RTL, GDSII, GERBER, etc.) stored on computer readable media.

Figure 21:
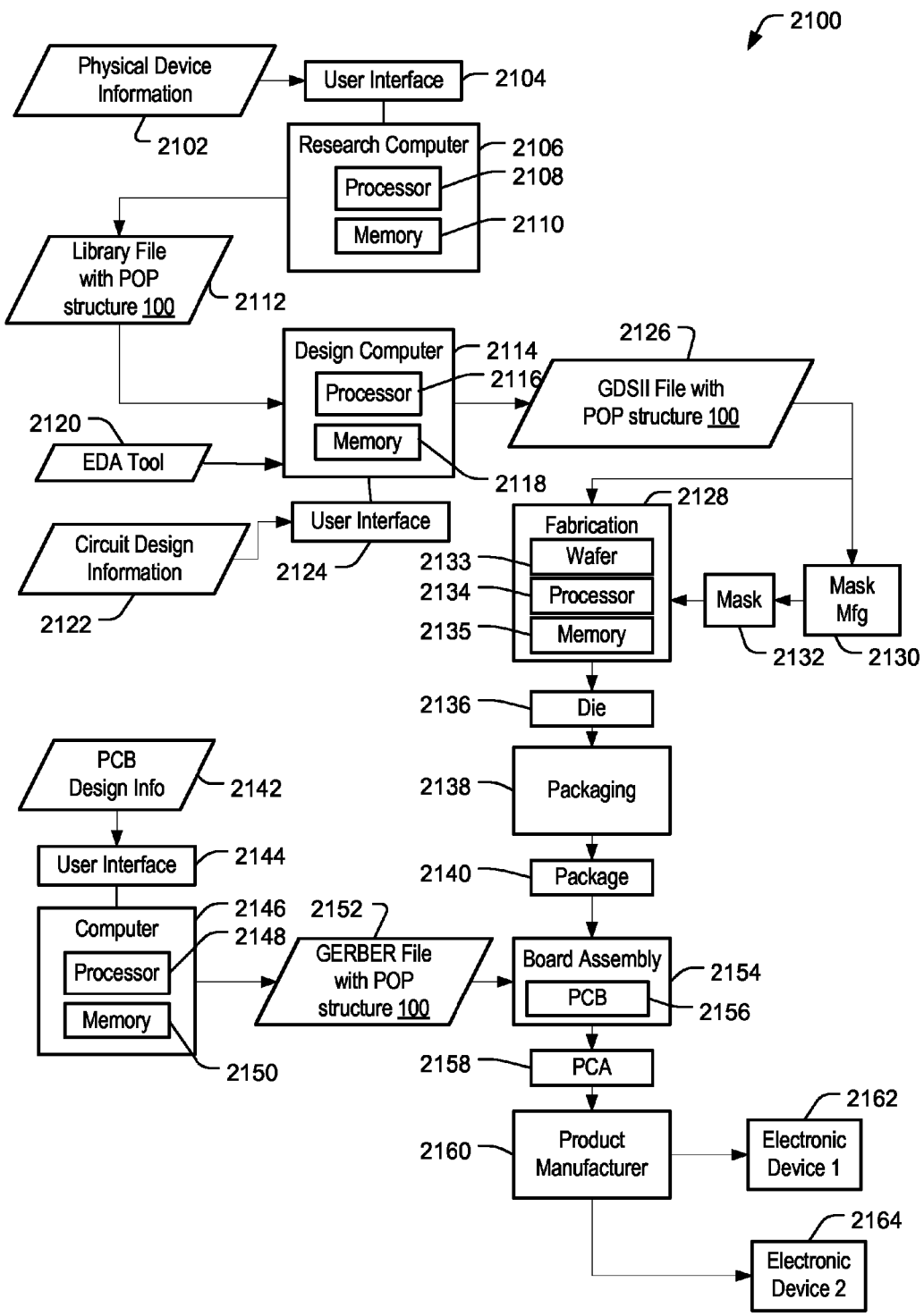
FIG. 21 is a data flow diagram of a particular illustrative aspect of a manufacturing process to manufacture electronic devices that include a POP structure.

Some or all such files may be provided to fabrication handlers who fabricate devices based on such files. Resulting products include semiconductor wafers that are then cut into semiconductor die and packaged into a semiconductor chip. The chips are then employed in devices described above. FIG. 21 depicts a particular illustrative aspect of an electronic device manufacturing process 2100.

Physical device information 2102 is received at the manufacturing process 2100, such as at a research computer 2106. The physical device information 2102 may include design information representing at least one physical property of a semiconductor device, such as the POP structure 100. For example, the physical device information 2102 may include physical parameters, material characteristics, and structure information that is entered via a user interface 2104 coupled to the research computer 2106. The research computer 2106 includes a processor 2108, such as one or more processing cores, coupled to a computer readable medium such as a memory 2110. The memory 2110 may store computer readable instructions that are executable to cause the processor 2108 to transform the physical device information 2102 to comply with a file format and to generate a library file 2112.

In a particular aspect, the library file 2112 includes at least one data file including the transformed design information. For example, the library file 2112 may include a library of semiconductor devices including a device that includes the POP structure 100, that is provided for use with an electronic design automation (EDA) tool 2120.

The library file 2112 may be used in conjunction with the EDA tool 2120 at a design computer 2114 including a processor 2116, such as one or more processing cores, coupled to a memory 2118. The EDA tool 2120 may be stored as processor executable instructions at the memory 2118 to enable a user of the design computer 2114 to design a circuit including the POP structure 100 of the library file 2112. For example, a user of the design computer 2114 may enter circuit design information 2122 via a user interface 1824 coupled to the design computer 2114. The circuit design information 2122 may include design information representing at least one physical property of a semiconductor device, such as the POP structure 100. To illustrate, the circuit design property may include identification of particular circuits and relationships to other elements in a circuit design, positioning information, feature size information, interconnection information, or other information representing a physical property of a semiconductor device.

The design computer 2114 may be configured to transform the design information, including the circuit design information 2122, to comply with a file format. To illustrate, the file formation may include a database binary file format representing planar geometric shapes, text labels, and other information about a circuit layout in a hierarchical format, such as a Graphic Data System (GDSII) file format. The design computer 2114 may be configured to generate a data file including the transformed design information, such as a GDSII file 2126 that includes information describing the POP structure 100 in addition to other circuits or information. To illustrate, the data file may include information corresponding to a system-in-package that includes the POP structure 100, and that also includes additional electronic circuits and components within the system-in-package.

The GDSII file 2126 may be received at a fabrication process 2128 to manufacture the POP structure according to transformed information in the GDSII file 2126. For example, a device manufacture process may include providing the GDSII file 2126 to a mask manufacturer 2130 to create one or more masks, such as masks to be used with photolithography processing, illustrated as a representative mask 2132. The mask 2132 may be used during the fabrication process to generate one or more wafers 2134, which may be tested and separated into dies, such as a representative die 2136. The die 2136 includes a circuit including a device that includes the POP structure 100.

The die 2136 may be provided to a packaging process 2138 where the die 2136 is incorporated into a representative package 2140. For example, the package 2140 may include the single die 2136 or multiple dies, such as a system-in-package (SiP) arrangement. The package 2140 may be configured to conform to one or more standards or specifications, such as Joint Electron Device Engineering Council (JEDEC) standards.

Information regarding the package 2140 may be distributed to various product designers, such as via a component library stored at a computer 2146. The computer 2146 may include a processor 2148, such as one or more processing cores, coupled to a memory 2150. A printed circuit board (PCB) tool may be stored as processor executable instructions at the memory 2150 to process PCB design information 2142 received from a user of the computer 2146 via a user interface 2144. The PCB design information 2142 may include physical positioning information of a packaged semiconductor device on a circuit board, the packaged semiconductor device corresponding to the package 2140 including the POP structure 100.

The computer 2146 may be configured to transform the PCB design information 2142 to generate a data file, such as a GERBER file 2152 with data that includes physical positioning information of a packaged semiconductor device on a circuit board, as well as layout of electrical connections such as traces and vias, where the packaged semiconductor device corresponds to the package 2140 including the POP structure 100. In other aspects, the data file generated by the transformed PCB design information may have a format other than a GERBER format.

The GERBER file 2152 may be received at a board assembly process 2154 and used to create PCBs, such as a representative PCB 2156, manufactured in accordance with the design information stored within the GERBER file 2152. For example, the GERBER file 2152 may be uploaded to one or more machines to perform various steps of a PCB production process. The PCB 2156 may be populated with electronic components including the package 2140 to form a representative printed circuit assembly (PCA) 2158.

The PCA 2158 may be received at a product manufacture process 2160 and integrated into one or more electronic devices, such as a first representative electronic device 2162 and a second representative electronic device 2164. As an illustrative, non-limiting example, the first representative electronic device 2162, the second representative electronic device 2164, or both, may be selected from the group of a set top box, a music player, a video player, an entertainment unit, a navigation device, a communications device, a personal digital assistant (PDA), a fixed location data unit, and a computer, into which the POP structure 100 is integrated. As another illustrative, non-limiting example, one or more of the electronic devices 2162 and 2164 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 21 illustrates remote units according to teachings of the disclosure, the disclosure is not limited to these illustrated units. Aspects of the disclosure may be suitably employed in any device which includes active integrated circuitry including memory and on-chip circuitry.

A device that includes the POP structure 100 may be fabricated, processed, and incorporated into an electronic device, as described in the illustrative process 2100. One or more aspects of the aspects disclosed with respect to FIGS. 1-20 may be included at various processing stages, such as within the library file 2112, the GDSII file 2126, and the GERBER file 2152, as well as stored at the memory 2110 of the research computer 2106, the memory 2118 of the design computer 2114, the memory 2150 of the computer 2146, the memory of one or more other computers or processors (not shown) used at the various stages, such as at the board assembly process 2154, and also incorporated into one or more other physical aspects such as the mask 2132, the die 2136, the package 2140, the PCA 2158, other products such as prototype circuits or devices (not shown), or any combination thereof. Although various representative stages of production from a physical device design to a final product are depicted, in other aspects fewer stages may be used or additional stages may be included. Similarly, the process 2100 may be performed by a single entity or by one or more entities performing various stages of the process 2100.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A package-on-package (POP) structure comprising:
a first die;
a second die;
a photo-imaged dielectric (PID) layer disposed between the first die and the second die;
a first conductive path from the first die through the PID layer to the second die, wherein the first conductive path extends directly through a first area of the PID layer between the first die and the second die; and
a second conductive path from the first die through the PID layer to the second die, wherein a particular portion of the second conductive path is perpendicular to the first conductive path and extends through a second area of the PID layer not directly between the first die and the second die.

2. The POP structure of claim 1, wherein the first conductive path and the second conductive path extend from a first surface of the first die to a second surface of the second die.

3. The POP structure of claim 1, wherein a first portion of the second conductive path from the first die to a first end of the particular portion of the second conductive path is parallel to the first conductive path, and wherein a second portion of the second conductive path from a second end of the particular portion of the second conductive path to the second die is parallel to the first conductive path.

4. The POP structure of claim 1, further comprising a via through the PID layer.

5. The POP structure of claim 4, wherein the first conductive path extends through the via to the second die.

6. The POP structure of claim 4, wherein the first conductive path extends through a seed layer, the via, a first conductive layer, solder, and a second conductive layer, to the second die.

7. The POP structure of claim 4, wherein the via includes copper.

8. The POP structure of claim 1, wherein the first die includes a processor.

9. The POP structure of claim 8, wherein the processor comprises an application processor, a digital signal processor, a graphics processor, or a combination thereof.

10. The POP structure of claim 1, wherein the second die includes a memory.

11. The POP structure of claim 10, wherein the memory comprises a cache memory.

12. The POP structure of claim 1, wherein the first die, the second die, and the PID layer are integrated into a computer, a communications device, a personal digital assistant (PDA), an entertainment unit, a navigation device, a music player, a video player, a fixed location data unit, a set top box, or a combination thereof.

13. An apparatus comprising:
first means for packaging a first integrated circuit (IC) that includes a first die and a photo-imaged dielectric (PID) layer; and
second means for packaging a second IC that includes a second die, wherein a first conductive path from the first die through the PID layer to the second die extends directly through the PID layer from the first die to the second die, and wherein a portion of a second conductive path from the first die through the PID layer to the second die is perpendicular to the first conductive path and extends through an area of the PID layer not directly between the first die and the second die.

14. The apparatus of claim 13, wherein the first means for packaging and the second means for packaging are integrated into a computer, a communications device, a personal digital assistant (PDA), an entertainment unit, a navigation device, a music player, a video player, a fixed location data unit, a set top box, or a combination thereof.

\* \* \* \* \*